US012772561B2

(12) United States Patent
Kobayashi

(10) Patent No.: US 12,772,561 B2
(45) Date of Patent: Oct. 20, 2026

(54) SEMICONDUCTOR APPARATUS AND EQUIPMENT

(71) Applicant: CANON KABUSHIKI KAISHA, Tokyo (JP)

(72) Inventor: Hiroaki Kobayashi, Kanagawa (JP)

(73) Assignee: CANON KABUSHIKI KAISHA, Tokyo (JP)

(*) Notice: Subject to any disclaimer, the term of this patent is extended or adjusted under 35 U.S.C. 154(b) by 363 days.

(21) Appl. No.: 18/461,990

(22) Filed: Sep. 6, 2023

(65) Prior Publication Data

US 2023/0411402 A1 Dec. 21, 2023

Related U.S. Application Data

(63) Continuation of application No. PCT/JP2022/008828, filed on Mar. 2, 2022.

(30) Foreign Application Priority Data

Mar. 8, 2021 (JP) ................................ 2021-036296
Jun. 30, 2021 (JP) ................................ 2021-109341

(51) Int. Cl.

| | |
|---|---|
| ***H01L 27/12*** | (2006.01) |
| ***H01L 29/786*** | (2006.01) |
| ***H10D 30/67*** | (2025.01) |
| ***H10D 86/01*** | (2025.01) |
| ***H10D 86/40*** | (2025.01) |
| ***H10D 86/60*** | (2025.01) |

(52) U.S. Cl.

CPC ....... *H10D 86/423* (2025.01); *H10D 30/6723* (2025.01); *H10D 30/6755* (2025.01); *H10D 86/0221* (2025.01); *H10D 86/471* (2025.01); *H10D 86/481* (2025.01); *H10D 86/60* (2025.01)

(58) Field of Classification Search

CPC ........ H05B 33/14; H05B 33/00; H05B 33/26; H05B 33/10; H10K 59/35; H10K 59/8794; H10K 59/8722; H10K 59/873; H10K 59/80522; H10K 59/122; H10K 59/131; H10D 30/6723; H10D 30/67; H10D 30/6755; H10D 30/021; H10D 30/01; H10D 86/423; H10D 86/40; H10D 86/0221; H10D 86/01; H10D 86/471; H10D 86/481; H10D 86/60; H10D 84/0126; H10D 84/01; H10D 84/0165; H10D 84/038; G09F 9/30

See application file for complete search history.

(56) References Cited

U.S. PATENT DOCUMENTS

| | | | | |
|---|---|---|---|---|
| 9,978,757 | B2 * | 5/2018 | Yamazaki .............. | H10B 69/00 |
| 10,373,983 | B2 * | 8/2019 | Takahashi ............ | H10D 86/471 |
| 10,998,342 | B2 * | 5/2021 | Hideo .................. | H10D 86/423 |

(Continued)

FOREIGN PATENT DOCUMENTS

| | | |
|---|---|---|
| CN | 102652356 A | 8/2012 |
| CN | 107863354 A | 3/2018 |

(Continued)

*Primary Examiner* — Nikolay K Yushin

(74) *Attorney, Agent, or Firm* — Canon U.S.A., Inc. IP Division

(57) ABSTRACT

A first element included in a semiconductor layer differs from a second element included in another semiconductor layer, and a third element included in a source electrode is same as a fourth element included in a gate electrode.

30 Claims, 13 Drawing Sheets

(56) References Cited

U.S. PATENT DOCUMENTS

| | | | | |
|---|---|---|---|---|
| 2015/0364477 | A1* | 12/2015 | Yamazaki | H10B 69/00 257/43 |
| 2017/0271378 | A1 | 9/2017 | Yamazaki | |
| 2018/0040640 | A1* | 2/2018 | Takahashi | H10D 86/423 |
| 2020/0295052 | A1* | 9/2020 | Hideo | H10D 86/423 |

FOREIGN PATENT DOCUMENTS

| | | | |
|---|---|---|---|
| CN | 109791949 | A | 5/2019 |
| JP | 2009540623 | A | 11/2009 |
| JP | 2014075699 | A | 4/2014 |
| JP | 2015156486 | A | 8/2015 |
| JP | 2018006733 | A | 1/2018 |
| JP | 2018018068 | A | 2/2018 |
| JP | 2018025777 | A | 2/2018 |
| JP | 2018050030 | A | 3/2018 |
| JP | 2020202223 | A | 12/2020 |

* cited by examiner 10,20 (T/C)

10,20 (B/C)

10,20 (B/S)

10,20 (T/S)

SEMICONDUCTOR APPARATUS AND EQUIPMENT

CROSS-REFERENCE TO RELATED APPLICATIONS

This application is a Continuation of International Patent Application No. PCT/JP2022/008828, filed Mar. 2, 2022, which claims the benefit of Japanese Patent Applications No. 2021-036296, filed Mar. 8, 2021, and No. 2021-109341, filed Jun. 30, 2021, all of which are hereby incorporated by reference herein in their entirety.

BACKGROUND OF THE INVENTION

Field of the Invention

The present invention relates to a semiconductor apparatus.

Background Art

There has been a technique of varying constituent elements of semiconductor layers of transistors disposed on the same substrate. Patent Document (PTL) 1 discusses a semiconductor apparatus that uses a thin-film transistor (TFT) including polysilicon and another TFT including an oxide semiconductor layer. Patent Document (PTL) 2 discusses a semiconductor apparatus including a first top-gate thin-film transistor using a polycrystal silicon layer as a channel, and a second top-gate thin-film transistor using an oxide semiconductor layer as another channel. In the semiconductor apparatus discussed in (PTL) 2, a common metal layer is used as a source and a drain of the first top-gate thin-film transistor, and a gate of the second top-gate thin-film transistor.

CITATION LIST

Patent Literature

PTL 1: Japanese Patent Laid-Open No. 2020-202223
PTL 1: Japanese Patent Laid-Open No. 2018-50030

In the technique discussed in PTL 1, consideration of cost reduction is not enough. The effect obtainable with the technique discussed in PTL 2 is applicable only in a limited structure. Thus, the present invention is directed to providing a technique advantageous in reducing cost of a semiconductor apparatus.

SUMMARY OF THE INVENTION

In a first aspect of a semiconductor apparatus according to the present invention, the semiconductor apparatus includes a substrate, a first semiconductor layer that is of a first transistor and disposed above the substrate, a first conductor layer disposed above the substrate and overlapping the first semiconductor layer, a second semiconductor layer that is of a second transistor and disposed above the substrate, and a second conductor layer disposed above the substrate and overlapping the second semiconductor layer, wherein a first element with a highest concentration in the first semiconductor layer among elements of Groups 12 to 16 included in the first semiconductor layer differs from a second element with a highest concentration in the second semiconductor layer among elements of Groups 12 to 16 included in the second semiconductor layer, wherein a third element with a highest concentration in the first conductor layer among metal elements or metalloid elements included in the first conductor layer is same as a fourth element with a highest concentration in the second conductor layer among metal elements or metalloid elements included in the second conductor layer, wherein the first conductor layer is in contact with the first semiconductor layer, wherein the second conductor layer is insulated from the second semiconductor layer, wherein the second conductor layer is disposed between the second semiconductor layer and the substrate, and wherein the second conductor layer is contiguous to the first conductor layer.

In the semiconductor apparatus according to a second aspect of the present invention, the second conductor layer is disposed between the second semiconductor layer and the substrate. A third aspect is that a third conductor layer disposed above the substrate and overlapping the second conductor layer is not in contact with the second semiconductor layer and is insulated from the second conductor layer. A fourth aspect is that the first transistor is of a P-type and the second transistor is of an N-type.

Further features of the present invention will become apparent from the following description of exemplary embodiments with reference to the attached drawings.

DESCRIPTION OF THE EMBODIMENTS

Figure 1A:
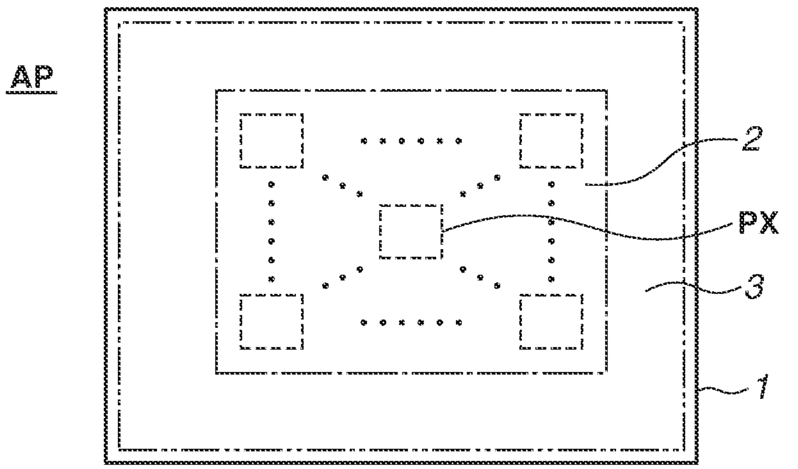
FIG. 1A is a schematic diagram illustrating a semiconductor apparatus.

Hereinafter, a mode for carrying out the present invention will be described with reference to the drawing. In the following description and drawings, configurations illustrated in common in a plurality of drawings are assigned the same reference numerals. The common configurations will be sometimes described with reference to the plurality of drawings without notice. In addition, the description of the configurations assigned the same reference numerals is sometimes omitted. Different components with the same name can be distinguished from each other by allocating "n-th" (n is a number") like a first component and a second component. In this specification, a case where A and B correspond to either C or D means any of a case where A and B correspond to C, a case where A and B correspond to D, a case where A corresponds to C and B corresponds to D, and a case where A corresponds to D and B corresponds to C.

FIG. 1A is a schematic plan view of a semiconductor apparatus AP. The semiconductor apparatus AP suitable for the present exemplary embodiment may include a pixel region 2 in which a plurality of pixel circuits PX are arrayed, and a peripheral region 3 disposed around the pixel region 2. In FIG. 1A, the pixel region 2 is a region surrounded by a dashed-dotted line, and the peripheral region 3 is a region between the dashed-dotted line and a dashed-two dotted line. The semiconductor apparatus AP including the pixel region 2 may be used as a display apparatus or an imaging apparatus. The present exemplary embodiment is also applicable to the semiconductor apparatus AP not including the pixel region 2 and the peripheral region 3, and is applicable to, for example, a calculation apparatus, a storage apparatus, or a communication apparatus.

Figure 1B:
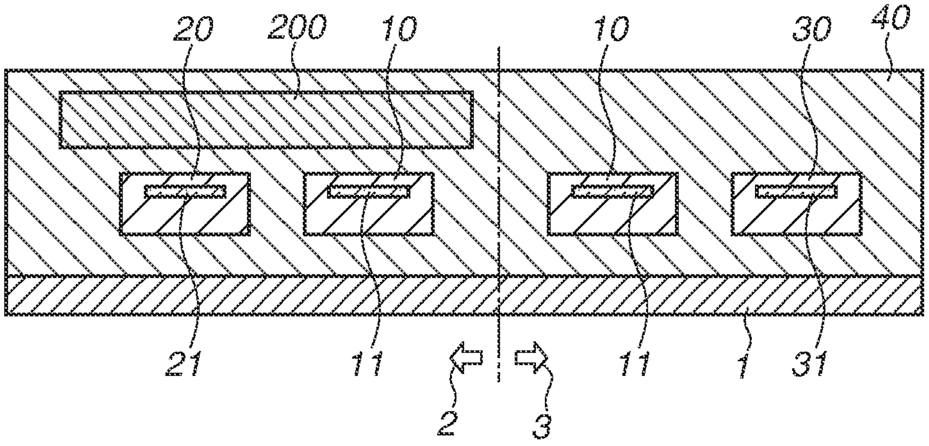
FIG. 1B is a schematic diagram illustrating the semiconductor apparatus.

FIG. 1B is a schematic cross-sectional view of the semiconductor apparatus AP. The semiconductor apparatus AP includes a substrate 1, a transistor 10 disposed above the substrate 1, and a transistor 20 disposed above the substrate 1. FIGS. 2A to 2D are schematic cross-sectional views each illustrating a configuration of the transistor 10 and the transistor 20. The transistor 10 includes a semiconductor layer 11 disposed above the substrate 1, and the transistor 20 includes a semiconductor layer 21 disposed above the substrate 1. The semiconductor layers 11 and 21 each include one or more types of elements of Groups 12 to 16. The semiconductor layers 11 and 21 can each include an element (for example, hydrogen) other than the elements of Groups 12 to 16, and the like.

The transistor 10 is disposed in at least either the pixel region 2 or the peripheral region 3. The transistor 20 is disposed in at least either the pixel region 2 or the peripheral region 3. Here, an example in which the transistors 10 are disposed in the pixel region 2 and the peripheral region 3, and the transistor 20 is disposed in the pixel region 2 is illustrated. In addition, a transistor 30 is disposed in the peripheral region 3 together with the transistor 10. The transistor 10 in the peripheral region 3 and the transistor 30 in the peripheral region 3 may together form a complementary integrated circuit, such as a complementary metal-oxide semiconductor (CMOS) circuit. In the complementary integrated circuit, the transistor 10 may be a P-type transistor and the transistor 30 may be an N-type transistor. Alternatively, in the complementary integrated circuit, the transistor 10 can be an N-type transistor and the transistor 30 can be a P-type transistor. While the transistor 10 may be whichever of an N-type transistor and a P-type transistor, it is desirable that the transistor 10 is an N-type transistor because an electron mobility is generally higher than a hole mobility. While the transistor 20 may be whichever of an N-type transistor and a P-type transistor, it is desirable that the transistor is an N-type transistor sing an electron mobility is generally higher than a hole mobility.

In the pixel region 2, a functional element 200 is disposed above the transistor (and the transistor 10). The functional element 200 is an element, such as a liquid crystal element, a light-emitting element, or a photoelectric conversion element, that is generally included in a pixel. The functional element 200 is connected to a transistor included in the pixel circuit PX, and the transistor to which the functional element 200 is connected is the transistor 20 or the transistor 10, for example.

As illustrated in FIG. 1B, an insulator 40 is disposed on the substrate 1. The insulator 40 is a stacked member that is an insulator film having various functions, such as an interlayer insulating film, a planarization film, a nonproliferation film, a protective film, and a sealing film that exist around the transistors 10, 20, and 30, aside from gate insulating films of the transistors 10, 20, and 30.

Figure 1C:
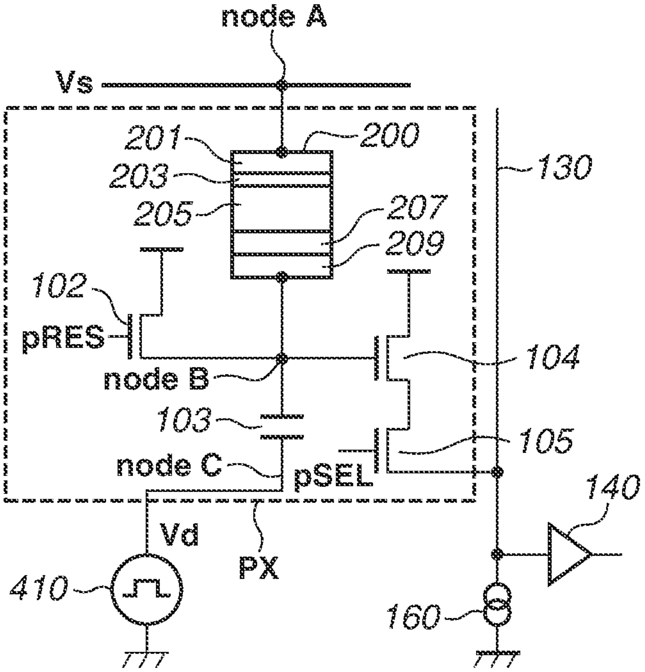
FIG. 1C is a schematic diagram illustrating the semiconductor apparatus.

FIG. 1C illustrates one of the pixel circuits PX of a case where the semiconductor apparatus AP is an imaging apparatus. The pixel circuit PX includes the functional element 200 functioning as a photoelectric conversion element, and an amplifier transistor 104 that amplifies a signal generated in the functional element 200. The functional element 200 functioning as a photoelectric conversion element includes a first electrode 201, a second electrode 209, a functional layer 205 disposed between the first electrode 201 and the second electrode 209, and an insulating layer 207 disposed between the functional layer 205 and the second electrode 209. The functional layer 205 is a photoelectric conversion layer made of an organic material, an inorganic material, or a hybrid material of an organic material and an inorganic material. The hybrid material can be a quantum dot material. The functional element 200 functioning as a photoelectric conversion element may include a blocking layer 203 disposed between the functional layer 205 and the first electrode 201. The blocking layer 203 is disposed to prevent charges of the same conductivity type as signal charges accumulated in the functional layer 205 from being injected from the first electrode 201 to the functional layer 205. The blocking layer 203 and the insulating layer 207 can be omitted. With such a configuration, a photoelectric conversion unit is able to accumulate charges generated in accordance with incident light, as signal charges. Then, a voltage to be supplied to the pixel circuit PX is controlled, whereby the photoelectric conversion unit reads out a signal from the photoelectric conversion element (the functional element 200).

The pixel PX includes a reset transistor 102, a capacitor 103, the amplifier transistor 104, and a selection transistor 105. A drain of the reset transistor 102 is connected to a node to which a reset voltage Vres is supplied. A source voltage Vs is supplied to a node A including the first electrode 201 of the functional element 200. A source of the reset transistor

102 is connected to the second electrode 209 of the functional element 200 and a gate of the amplifier transistor 104. In this configuration, the reset transistor 102 resets a voltage at a node B to the reset voltage Vres. That is, the reset transistor 102 is a reset unit that supplies the reset voltage Vres to the second electrode 209. When the reset transistor 102 is turned off, the node B including the second electrode 209 of the functional element 200 (photoelectric conversion element) enters an electrically-floating state. A node C is capacitively coupled to the node B via the capacitor 103. A first terminal of the capacitor 103 is connected to the node B. A voltage Vd from a voltage supply unit 410 is supplied to the node C to which a second terminal of the capacitor 103 is connected. The node B includes the gate of the amplifier transistor 104. The amplifier transistor 104 is an amplification unit, and the gate of the amplifier transistor 104 is an input node of the amplification unit. That is, the second electrode 209 of the functional element 200 is electrically-connected to the amplification unit. In this configuration, the amplification unit amplifies a signal generated in the functional element 200 (photoelectric conversion element), and output the amplified signal. A drain of the amplifier transistor 104 is connected to a node to which a source voltage is supplied. A source of the amplifier transistor 104 is connected to an output line 130 via the selection transistor 105. A current source 160 is connected to the output line 130. The amplifier transistor 104 and the current source 160 form a source follower circuit, and output a signal based on charges generated in the functional element 200 to the output line 130. A column circuit 140 is further connected to the output line 130. A signal output to the output line 130 from the pixel circuit PX is input to the column circuit 140.

Figure 1D:
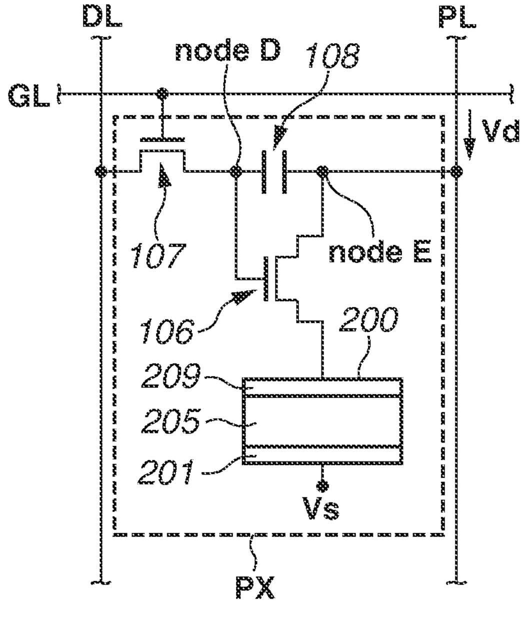
FIG. 1D is a schematic diagram illustrating the semiconductor apparatus.

FIG. 1D illustrates one of the pixel circuit PX of a case where the semiconductor apparatus AP is a display apparatus. The pixel circuit PX includes the functional element 200 functioning as an organic electroluminescence (EL) element, and the functional element 200 can include the first electrode 201, the second electrode 209, and the functional layer 205 disposed between the first electrode 201 and the second electrode 209. The functional layer 205 is a light emission layer made of an organic material or an inorganic material. The first electrode 201 is a cathode, for example, and the second electrode 209 is an anode, for example. A light emission color of the light emission layer of the functional element 200 functioning as an organic EL element may be varied to red, green, or blue for each sub-pixel, or the light emission color of each sub-pixel may be set to white and light may be dispersed using a color filter.

The pixel circuit PX includes a selection transistor 107, a drive transistor 106, and a capacitor 108. A source voltage Vd is supplied to the drive transistor 106 from a power line PL, and a source voltage Vs is supplied to the first electrode 201. The source voltage Vs may be a voltage lower than the source voltage Vd. In response to a scanning signal applied to a scanning line GL, the selection transistor 107 outputs an applied data signal to a data line DL. The capacitor 108 is charged with a voltage corresponding to a data signal received via the selection transistor 107. A source or a drain of the selection transistor 107 is connected to a node D. A gate of the drive transistor 106 is connected to the node D. The drive transistor 106 is connected to a node E. The drive transistor 106 is connected to the second electrode 209 of the functional element 200. One of a source and a drain of the drive transistor 106 is connected to the node E, and the other one of the source and the drain of the drive transistor 106 is connected to the second electrode 209. The voltage Vd is supplied to the node E from a voltage supply unit. A first terminal of the capacitor 108 is connected to the node D. In this example, a second terminal of the capacitor 108 is connected to the node E, and the node E is capacitively coupled to the node D via the capacitor 108. Alternatively, the capacitor 108 can be connected to a node to which the second electrode 209 is connected, instead of the node E. The drive transistor 106 controls a drive current flowing through the functional element 200, in accordance with a charge amount stored in the capacitor 108. In this configuration, the functional element 200 functioning as a light-emitting element emits light at luminance corresponding to a data level of the data signal.

The pixel circuit PX described with reference to FIG. 1C or 1D is merely an example, and the configuration is not limited to this. The pixel circuit PX can further include a plurality of transistors, and can include a larger number of capacitors. The capacitor 103 and the capacitor 108 may be of a metal-insulator-semiconductor (MIS) type in which a dielectric layer is between a conductor layer and a semiconductor layer, may be of a metal-insulator-metal (MIM) type in which a dielectric layer is between a conductor layer and a conductor layer, or may have a structure in which a dielectric layer is between a semiconductor layer and a semiconductor layer.

In the above-described pixel circuit PX, for example, the selection transistor 105, the reset transistor 102, and the selection transistor 107 may be switch transistors. These switch transistors may correspond to the above-described transistor 20. In the above-described pixel circuit PX, for example, the amplifier transistor 104 and the drive transistor 106 differ from the switch transistors in that the amplifier transistor 104 and the drive transistor 106 output potentials correlated with potentials input to their gates, and these transistors can correspond to the transistor 10. The capacitor 103 and the capacitor 108 have a common function in that the capacitor 103 and the capacitor 108 hold a charge amount corresponding to a signal level of a pixel. It is desirable that the reset transistor 102 and the selection transistor 107 directly connected to the capacitor 103 and the capacitor 108, respectively, correspond to the transistor 10. The amplifier transistor 104 and the drive transistor 106 directly connected to the capacitor 103 and the capacitor 108, respectively can correspond to the transistor 20.

FIGS. 2A to 2D are schematic cross-sectional views illustrating a configuration of the transistor 10 and the transistor 20. FIGS. 2A to 2D illustrate four different configurations of the transistor 10 and the transistor 20. First of all, points common to the configurations will be described.

The transistor 10 includes the semiconductor layer 11, a gate electrode 12, a source electrode 13, a drain electrode 14, and a gate insulating film 15 that are disposed above the substrate 1. The gate electrode 12, the source electrode 13, and the drain electrode 14 overlap the semiconductor layer 11. The gate electrode 12 is insulated with the gate insulating film 15 from the semiconductor layer 11, and the source electrode 13 and the drain electrode 14 is in contact with the semiconductor layer 11. In the transistor the gate electrode 12 is disposed on a channel of the semiconductor layer 11, and the gate insulating film 15 is disposed between the semiconductor layer 11 and the gate electrode 12. In the transistor 10, the source electrode 13 is disposed on a source of the semiconductor layer 11, and the drain electrode 14 is disposed on a drain of the semiconductor layer 11.

The transistor 20 includes the semiconductor layer 21, a gate electrode 22, a source electrode 23, a drain electrode 24, and a gate insulating film 25 that are disposed above the substrate 1. The gate electrode 22, the source electrode 23, and the drain electrode 24 overlap the semiconductor layer 21. The gate electrode 22 is insulated with the gate insulating film 25 from the semiconductor layer 21, and the source electrode 23 and the drain electrode 24 is in contact with the semiconductor layer 21. In the transistor 20, the gate electrode 22 is disposed above the semiconductor layer 21, and the gate insulating film 25 is disposed between the semiconductor layer 21 and the gate electrode 22. In the transistor 20, the source electrode 23 is disposed on a source of the semiconductor layer 21, and the drain electrode 24 is disposed on a drain of the semiconductor layer 21.

Among the elements of Groups 12 to 16 that are included in the semiconductor layer 11, an element with the highest concentration in the semiconductor layer 11 will be described as an element S1. Among the elements of Groups 12 to 16 that are included in the semiconductor layer 21, an element with the highest concentration in the semiconductor layer 21 will be described as an element S2. In the present exemplary embodiment, the element S1 differs from the element S2.

The semiconductor layers 11 and 21 may be Group IV semiconductors, such as silicon (S1), germanium (Ge), fullerene, and carbon nanotube. In this case, the elements S1 and S2 in the semiconductor layers 11 and 21 may be elements of Group 14. The semiconductor layers 11 and 21 may be Group II-VI compound semiconductors, such as zinc selenide (ZnSe), cadmium sulfide (CdS), and zinc oxide (ZnO). In this case, the elements S1 and S2 in the semiconductor layers 11 and 21 may be elements of Group 12 or 16. The semiconductor layers 11 and 21 may be oxide semiconductors, such as indium gallium zinc oxide (InGaZnO) and indium tin zinc oxide (InSnZnO). In this case, the elements S1 and S2 in the semiconductor layers 11 and 21 may be oxygen (elements of Group 16) or elements of Groups 12 to 14. The concentration of oxygen in an oxide semiconductor is more than or equal to 50 atomic percentage (at %), less than or equal to 70 at %, less than or equal to 67 at %, or at 60 at %, for example. The semiconductor layers 11 and 21 may be Group III-V compound semiconductors, such as gallium arsenide (GaAs), indium phosphide (InP), and gallium nitride (GaN). In this case, the elements S1 and S2 in the semiconductor layers 11 and 21 may be elements of Group 13 or 15. The semiconductor layers 11 and 21 may be Group IV compound semiconductors, such as silicon carbide (SiC) and silicon germanium (SiGe). In this case, the elements S1 and S2 in the semiconductor layers 11 and 21 may be elements of Group 14. The semiconductor layers 11 and 21 may be organic semiconductors. In this case, the elements S1 and S2 in the semiconductor layers 11 and 21 can be carbon (elements of Group 14).

The semiconductor layers 11 and 21 are at least any of a monocrystalline layer, a polycrystalline layer, and a noncrystalline layer. The semiconductor layers 11 and 21 may be a multilayered member including a plurality of types of layers of a monocrystalline layer, a polycrystalline layer, and a noncrystalline layer. To achieve a large area of the semiconductor apparatus AP, the semiconductor layers 11 and 21 is desirably a thin-film transistor (TFT) that uses a polycrystalline layer or a noncrystalline layer.

The gate electrodes 12 and 22, the source electrodes 13 and 23, and the drain electrodes 14 and 24 each include at least one conductor layer. In a case where the gate electrodes 12 and 22 have a multilayered structure including a plurality of conductor layers, lowermost or uppermost conductor layers of the gate electrodes 12 and 22 are in contact with the gate insulating films 15 and 25. In a case where the source electrodes 13 and 23 and the drain electrodes 14 and 24 have a multilayered structure including a plurality of conductor layers, lowermost or uppermost conductor layers of the source electrodes 13 and 23 and the drain electrodes 14 and 24 are in contact with the semiconductor layers 11 and 21. In the below description of the conductor layers of the gate electrodes 12 and 22, the source electrodes 13 and 23, and the drain electrodes 14 are 24, the conductor layers may be conductor layers closest to the semiconductor layers 11 and 21.

A conductor member overlapping the semiconductor layer 11 and insulated from the semiconductor layer 11 may be disposed above the substrate 1 aside from the gate electrode 12. A conductor member 28 (to be described below) overlapping the semiconductor layer 21 and insulated from the semiconductor layer 21 may be disposed above the substrate 1 aside from the gate electrode 22. The conductor member 28 is able to be used as an auxiliary electrode, a wire, a light shielding member, or a height difference adjustment member for the transistor 20, or the like. While another conductor layer may exist between the conductor member 28 and the semiconductor layer 21, the other conductor layer needs not exist between the conductor member 28 and the semiconductor layer 21.

The conductor layer of the source electrode 13 and the conductor layer of the drain electrode 14 are each made of one or more types of metal elements or metalloid elements. Among the metal elements or metalloid elements included in the conductor layer of the source electrode 13 and the conductor layer of the drain electrode 14, an element with the highest concentration in the source electrode 13 or the drain electrode 14 will be described as an element M1.

The conductor layer of the gate electrode 22 is made of one or more types of metal elements or metalloid elements. Among the metal elements or metalloid elements included in the gate electrode 22, an element with the highest concentration in the gate electrode 22 will be described as an element M2.

The conductor layer of the gate electrode 12 is made of one or more types of metal elements or metalloid elements. Among the metal elements or metalloid elements included in the conductor layer of the gate electrode 12, an element with the highest concentration in the conductor layer of the gate electrode 12 will be described as an element M3.

The conductor layer of the source electrode 23 and the conductor layer of the drain electrode 24 are made of one or more types of metal elements or metalloid elements. Among the metal elements or metalloid elements included in the conductor layer of the source electrode 23 and the conductor layer of the drain electrode 24, an element with the highest concentration in the gate electrode 22 will be described as an element M4.

The element M3 that is a metal element or a metalloid element included in the gate electrode 12 may differ from the element S2 included in the semiconductor layer 21. The element M4 that is a metal element or a metalloid element included in the gate electrode 22 may differ from the element S1 included in the semiconductor layer 11.

The conductor layer of the conductor member 28 overlaps the semiconductor layer 21 and is insulated from the semiconductor layer 21. The conductor layer of the conductor member 28 is made of one or more types of metal elements or metalloid elements other than the gate electrode 22. Among the metal elements or metalloid elements included in the conductor layer of the conductor member 28, an element with the highest concentration in the conductor member 28 will be described as an element M5.

The element M1 that is a metal element or a metalloid element included in the source electrode 13 or the drain electrode 14 may differ from the element S2 included in the semiconductor layer 21.

The element M2 that is a metal element or a metalloid element included in the gate electrode 22 may differ from the element S1 included in the semiconductor layer 11. The element M3 that is a metal element or a metalloid element included in the gate electrode 12 may differ from the element S2 included in the semiconductor layer 21.

The element M4 that is a metal element or a metalloid element included in the source electrode 23 and the drain electrode 24 may differ from the element S1 included in the semiconductor layer 11.

The element M5 that is a metal element or a metalloid element included in the conductor member 28 may differ from the element S1 included in the semiconductor layer 11.

The difference in the main constituent elements between the gate electrode of either the transistor 10 or the transistor 20 and the semiconductor layer of the other one of the transistor 10 and the transistor 20 is advantageous in achieving the characteristics of the electrodes of the transistor 10 and 20.

For example, the elements M1 to M4 are elements of Groups 3 to 13, and can be elements of Groups 3 to 9. Typically, the elements M1 to M4 may be any of gold (Au), silver (Ag), copper (Cu), platinum (Pt), molybdenum (Mo), tungsten (W), tantalum (Ta), and titanium (Ti). In particular, the elements M1 to M4 are desirably any of Cu, Mo, W, and Ti.

In the present exemplary embodiment, the element M1 and the element M2 may be the same. Elements being the same means that atomic numbers of the elements are the same. Using the same element in the source electrode 13, the drain electrode 14, and the gate electrode 22 results in reduction in cost in designing, procurement, and manufacturing.

In the present exemplary embodiment, the element M1 and the element M5 may be the same. Elements being the same means that atomic numbers of the elements are the same. Using the same element in the source electrode 13, the drain electrode 14, and the conductor member 28 results in reduction in cost in designing, procurement, and manufacturing.

While, in FIGS. 2A to 2D, the illustration of the insulator 40 on the substrate 1 that is illustrated in FIG. 1B is omitted, an insulator film, such as a gate insulating film or an interlayer insulating film, can be disposed around the semiconductor layers 11 and 21 as at least part of the insulator 40.

Figure 2A:
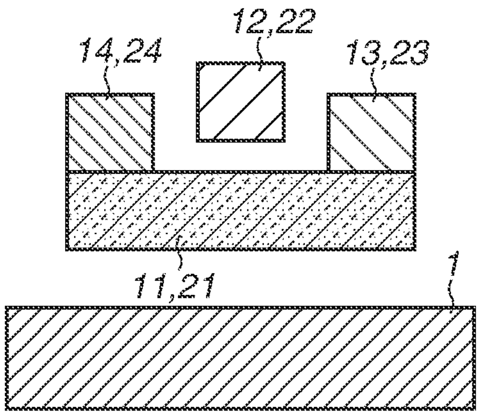
FIG. 2A is a schematic diagram illustrating a type of a transistor.
Figure 2B:
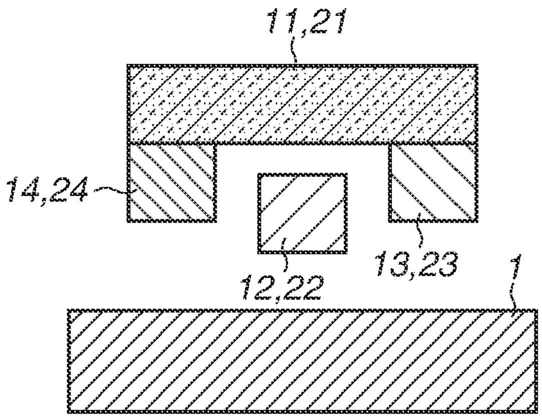
FIG. 2B is a schematic diagram illustrating a type of the transistor.
Figure 2C:
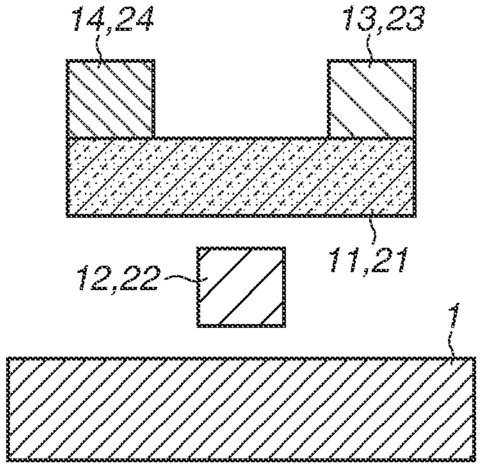
FIG. 2C is a schematic diagram illustrating a type of the transistor.
Figure 2D:
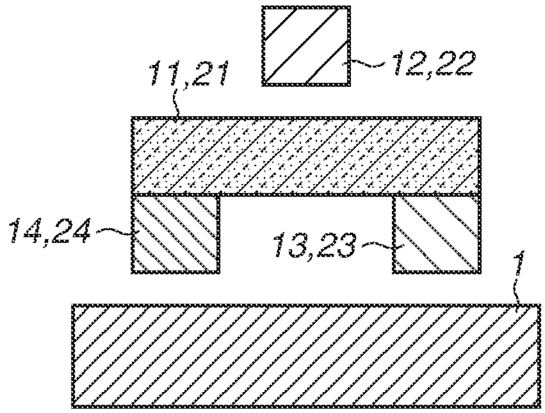
FIG. 2D is a schematic diagram illustrating a type of the transistor.

The T-type transistor 10 illustrated in FIGS. 2A and 2D, the semiconductor layer 11 is disposed between the substrate 1 and the gate electrode 12. In addition, in the T-type transistor 20, the semiconductor layer 21 is disposed between the substrate 1 and the gate electrode 22.

In the C-type transistor 10 illustrated in FIGS. 2A and 2B, the gate electrode 12, the source electrode 13, and the drain electrode 14 of the transistor 10 are disposed on one of a side facing the substrate 1 with respect to the semiconductor layer 11 and an opposite side of the side facing the substrate 1. In the example illustrated in FIG. 2A, the gate electrode 12, the source electrode 13, and the drain electrode 14 are disposed on the opposite side of the side facing the substrate 1 with respect to the semiconductor layer 11. In the example illustrated in FIG. 2B, the gate electrode 12, the source electrode 13, and the drain electrode 14 are disposed on the side facing the substrate 1 with respect to the semiconductor layer 11. In the C-type transistor 10, the gate electrode 12 may be disposed between the source electrode 13 and the drain electrode 14.

In the C-type transistor 20 illustrated in FIGS. 2A and 2B, the gate electrode 22, the source electrode 23, and the drain electrode 24 of the transistor 20 are disposed on one of a side facing the substrate 1 with respect to the semiconductor layer 21 and an opposite side of the side facing the substrate 1. In the example illustrated in FIG. 2A, the gate electrode 22, the source electrode 23, and the drain electrode 24 are disposed on the opposite side of the side facing the substrate 1 with respect to the semiconductor layer 21. In the example illustrated in FIG. 2B, the gate electrode 22, the source electrode 23, and the drain electrode 24 are disposed on the side facing the substrate 1 with respect to the semiconductor layer 21. In the C-type transistor 20, the gate electrode 22 may be disposed between the source electrode 23 and the drain electrode 24.

In the B-type transistor 10 illustrated in FIGS. 2B and 2C, the gate electrode 12 is disposed between the substrate 1 and the semiconductor layer 11. In addition, in the B-type transistor 20, the gate electrode 22 is disposed between the substrate 1 and the semiconductor layer 21.

In the S-type transistor 10 illustrated in FIGS. 2C and 2D, the semiconductor layer 11 is disposed between the gate electrode 12 and the source electrode 13. In addition, in the S-type transistor 10, the semiconductor layer 11 is disposed between the gate electrode 12 and the drain electrode 14. In addition, in the S-type transistor 20, the semiconductor layer 21 is disposed between the gate electrode 22 and the source electrode 23. In addition, in the S-type transistor 20, the semiconductor layer 21 is disposed between the gate electrode 22 and the drain electrode 24.

In a second exemplary embodiment, both the transistor 10 and the transistor 20 disposed above a single substrate, i.e., the substrate 1, are of T type. In this case, it is desirable that both the transistor 10 and the transistor 20 are of C type, and it is also desirable that both the transistor 10 and the transistor 20 are of S type. Alternatively, the type of the transistor 10 can be one of C type and S type, and the type of the transistor 20 can be the other one of C type and S type.

In a third exemplary embodiment, both the transistor 10 and the transistor 20 disposed above a single substrate, i.e., the substrate 1, are B-type transistors. In this case, it is desirable that both the transistor 10 and the transistor 20 are of C type, and it is also desirable that both the transistor 10 and the transistor 20 are of S type. Alternatively, the type of the transistor 10 can be one of C type and S type, and the type of the transistor 20 can be the other one of C type and S type.

In a fourth exemplary embodiment, both the transistor 10 and the transistor 20 disposed above a single substrate, i.e., the substrate 1, are C-type transistors. In this case, it is desirable that both the transistor 10 and the transistor 20 are of T type, and it is also desirable that both the transistor 10 and the transistor 20 are of B type. Alternatively, the type of the transistor 10 can be one of T type and B type, and the type of the transistor 20 can be the other one of T type and B type.

In a fifth exemplary embodiment, both the transistor 10 and the transistor 20 disposed above a single substrate, i.e., the substrate 1, are S-type transistor. In this case, it is desirable that both the transistor 10 and the transistor 20 are of T type, and it is also desirable that both the transistor 10 and the transistor 20 are of B type. Alternatively, the type of the transistor 10 can be one of T type and B type, and the type of the transistor 20 can be the other one of T type and B type.

Using the same type transistors as both the transistor 10 and the transistor 20 disposed above a single substrate, i.e., the substrate 1, as in the second to fifth exemplary embodiments, results in simplification of the configuration of the semiconductor apparatus AP, and cost reduction in designing and manufacturing of the semiconductor apparatus AP.

In a sixth exemplary embodiment, the element M2 included in the gate electrode 22 is the same as the element M4 included in the source electrode 23 and the drain electrode 24. Using the same element in the three electrodes of the transistor 20 results in cost reduction.

In a seventh exemplary embodiment, the element M3 included in the gate electrode 12 is the same as the element M1 included in the source electrode 13 and the drain electrode 14. Using the same element in the three electrodes of the transistor 10 results in cost reduction.

In an eight exemplary embodiment, the gate electrode 22 has a conductor layer including the element M4 which is the same as the element M1 included in the source electrode 13 and the drain electrode 14. The conductor layer of the gate electrode 22 can be contiguous to the conductor layer of the source electrode 13 or the conductor layer of the drain electrode 14. The conductor layer of the gate electrode 22 that includes the element M4 can be noncontiguous to the conductor layer of the source electrode 13 or the conductor layer of the drain electrode 14 that includes the element M1.

In a ninth exemplary embodiment, the conductor member 28 has a conductor layer including the element M5 which is the same as the element M1 included in the source electrode 13 and the drain electrode 14. The semiconductor layer 21 is disposed between the gate electrode 22 and the conductor member 28 (the conductor layer including the element M5). In the ninth exemplary embodiment, a conductor layer including the element M5 which is the same as the element M1 is the conductor member 28. The conductor layer of the conductor member 28 that includes the element M5 can be contiguous to the conductor layer of the source electrode 13 or the conductor layer of the drain electrode 14 that includes the element M1. The conductor layer of the conductor member 28 can be noncontiguous to the conductor layer of the source electrode 13 or the conductor layer of the drain electrode 14 that includes the element M1.

The potential of the conductor member 28 (the conductor layer including the element M5) can be the same as the potential of any of the gate electrode 12, the source electrode 13, the drain electrode 14, the gate electrode 22, the source electrode 23, and the drain electrode 24. In particular, the potential of the conductor member 28 (the conductor layer including the element M5) can be the same as the potential of the gate electrode 22. To achieve this, the gate electrode 22 and the conductor member 28 can be electrically connected with each other. The conductor layer of the gate electrode 22 that includes the element M2, and the conductor layer of the conductor member 28 that includes the element M5 can be in contact with each other, or both the conductor layers can be electrically connected via another conductor layer (for example, via). With the gate electrode 22 and the conductor member 28 disposed on both sides of the semiconductor layer 21, an electric field to be added to the semiconductor layer 21 is controlled. The potential of the conductor member 28 (the conductor layer including the element M5) can differ from any of the potentials of the gate electrode 12, the source electrode 13, the drain electrode 14, the gate electrode 22, the source electrode 23, and the drain electrode 24, or can be a floating potential.

The element M3 that is a metal element or a metalloid element included in the gate electrode 12 may differ from the element M2 that is a metal element or a metalloid element included in the gate electrode 22. The difference in the main metal elements or metalloid elements included in the gate electrodes 12 and 22 is advantageous in achieving the characteristics of the transistors 10 and 20.

Among the elements of Groups 12 to 16 that are included in the semiconductor layer 11, an element with the second highest concentration in the semiconductor layer 11 after the element S1 will be described as an element S3. In a case where the semiconductor layer 11 is a binary compound semiconductor, the semiconductor layer 11 is a compound of the element S1 and the element S3. Among the elements of Groups 12 to 16 that are included in the semiconductor layer 21, an element with the second highest concentration in the semiconductor layer 21 after the element S2 will be described as an element S4. When the semiconductor layer 21 is a binary compound semiconductor, the semiconductor layer 21 is a compound of the element S2 and the element S4. The element S3 included in the semiconductor layer 11 may differ from the element S4 included in the semiconductor layer 21.

In a case where the elements S1 and S2 are oxygen (O) in an oxide semiconductor, such as InGaZnO or InSnZnO, the elements S3 and S4 may be zinc (Zn). In an oxide semiconductor, such as InGaZnO or InSnZnO, the concentration of zinc may be 10 to 30 at % or 10 to 20 at %, or 16 at %, for example. In a case where the elements S1 and S2 are oxygen (O) in an oxide semiconductor, such as InGaZnO or InSnZnO, the elements S3 and S4 may be indium (In). The concentration of indium may be 5 to 20 at %, or 14 at %, for example. In an oxide semiconductor, such as InGaZnO or InSnZnO, the concentrations of gallium (Ga) and tin (Sn) may be lower than the concentration of zinc (Zn). In an oxide semiconductor, such as InGaZnO or InSnZnO, the concentrations of gallium (Ga) and tin (Sn) may be lower than the concentration of indium (In). In an oxide semiconductor, such as InGaZnO or InSnZnO, the concentrations of gallium (Ga) and tin (Sn) may be 5 to 20 at %, or 10 at %, for example. In InGaZnO, for example, In:Ga:Zn:O=16:10:14:60 is obtained.

In a tenth exemplary embodiment, a conductor layer including an element (for example, the element M2 or the element M5) which is the same as the element M1 included in the conductor layer of the source electrode 13 or the conductor layer of the drain electrode 14 may be of the same layer as the conductor layer of the source electrode 13 or the drain electrode 14. The conductor layers being the same layer means that the conductor layers are layers formed from a single film. Even if the conductor layers are the same layer, heights of the two layers from the substrate 1 may be different from each other due to a base height difference generated during film formation. In addition, in a case where the conductor layers are of the same layer, the two layers can have substantially the same thickness. Here, the two layers having substantially the same thickness means that the thickness of one layer falls within the range of 90 to 110 percent (%) of the thickness of the other layer.

Combinations of types of the transistors 10 and 20 will be described with reference to Table 1.

TABLE 1

| | Transistor 10 | | Transistor 20 | | |
|---|---|---|---|---|---|
| | TB | CS | TB | CS | M |
| No. 01 | T | C | T | C | G |
| No. 02 | T | C | T | C | N |
| No. 03 | T | S | T | C | G |
| No. 04 | T | S | T | C | N |
| No. 05 | B | C | T | C | G |
| No. 06 | B | C | T | C | N |
| No. 07 | B | S | T | C | G |
| No. 08 | B | S | T | C | N |
| No. 09 | T | C | T | S | G |
| No. 10 | T | C | T | S | N |
| No. 11 | T | S | T | S | G |
| No. 12 | T | S | T | S | N |
| No. 13 | B | C | T | S | G |
| No. 14 | B | C | T | S | N |
| No. 15 | B | S | T | S | G |
| No. 16 | B | S | T | S | N |
| No. 17 | T | C | B | C | G |
| No. 18 | T | C | B | C | N |
| No. 19 | T | S | B | C | G |
| No. 20 | T | S | B | C | N |
| No. 22 | B | C | B | C | G |
| No. 22 | B | C | B | C | N |
| No. 23 | B | S | B | C | G |
| No. 24 | B | S | B | C | N |
| No. 25 | T | C | B | S | G |
| No. 26 | T | C | B | S | N |
| No. 27 | T | S | B | S | G |
| No. 28 | T | S | B | S | N |
| No. 29 | B | C | B | S | G |
| No. 30 | B | C | B | S | N |
| No. 31 | B | S | B | S | G |
| No. 32 | B | S | B | S | N |

In Table 1, 32 patterns of combinations of types of the transistors 10 and 20 are listed. In Table 1, when the transistors 10 and 20 are of T type, "T" is described on a TB column, and when the transistors 10 and 20 are of B type, "B" is described on the TB column. When the transistors 10 are 20 are of C type, "C" is described on a CS column, and when the transistors 10 and 20 are of the S type, "S" is described on the CS column. In Table 1, when a component including the same element as the element M1 included in the source electrode 13 and the drain electrode 14 is the gate electrode 22, "G" is described on an M column. In addition, when a component including the same element as the element M1 included in the source electrode 13 and the drain electrode 14 is the conductor member 28 other than the gate electrode 22, "N" is described on the M column.

Nos. 01 to 04 and Nos. 09 to 12 correspond to the second exemplary embodiment. Nos. 21 to 24 and Nos. 29 to 32 correspond to the third exemplary embodiment. Nos. 01, 02, 05, and 06, and Nos. 17, 18, 21, and 22 correspond to the fourth exemplary embodiment. Nos. 11, 12, 15, and 16, and Nos. 27, 28, 31, and 32 correspond to the fifth exemplary embodiment. Odd-numbered examples in which "G" is described on the M column correspond to the eighth exemplary embodiment. Even-numbered examples in which "N" is described on the M column correspond to the ninth exemplary embodiment.

Figure 3A:
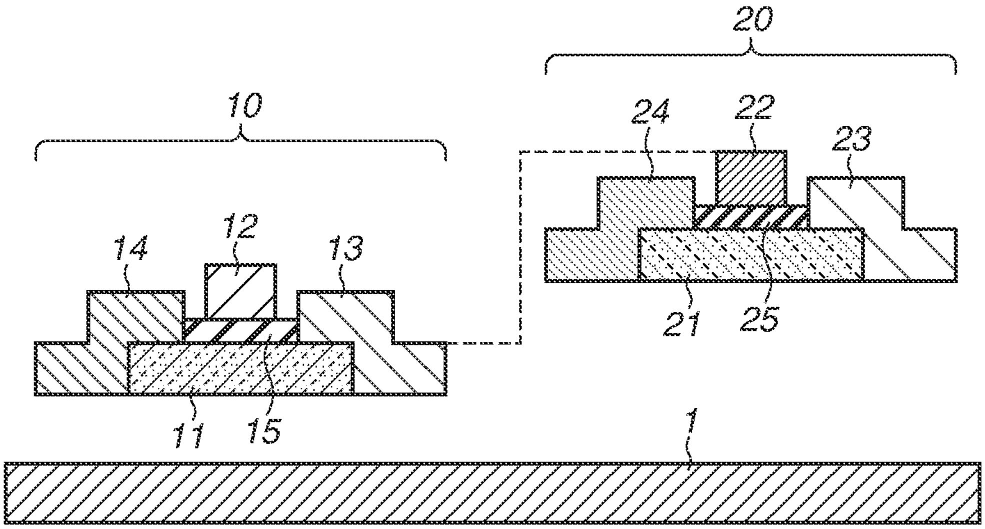
FIG. 3A is a schematic diagram illustrating the semiconductor apparatus.

FIG. 3A illustrates an example of a cross-sectional view of the semiconductor apparatus AP having the configuration of No. 01 in Table 1, using a dot-dash-line in combination. The dot-dash-line in FIG. 3A indicates that members connected by the dot-dash-line are of the same layer. More specifically, the dot-dash-line indicates that the source electrode 13 (and the drain electrode 14) is in the same layer as the gate electrode 22.

Figure 3B:
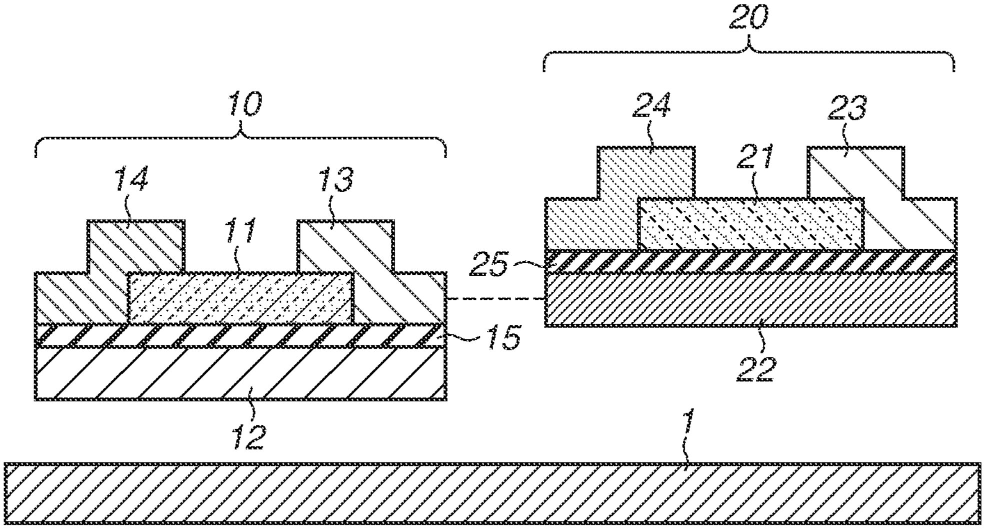
FIG. 3B is a schematic diagram illustrating the semiconductor apparatus.

FIG. 3B illustrates an example of a cross-sectional view of the semiconductor apparatus AP having the configuration of No. 31 in Table 1, using a dot-dash-line in combination. The dot-dash-line in FIG. 3B indicates that members connected by the dot-dash-line are of the same layer. More specifically, the dot-dash-line indicates that the source electrode 13 (and the drain electrode 14) is in the same layer as the gate electrode 22.

Figure 4A:
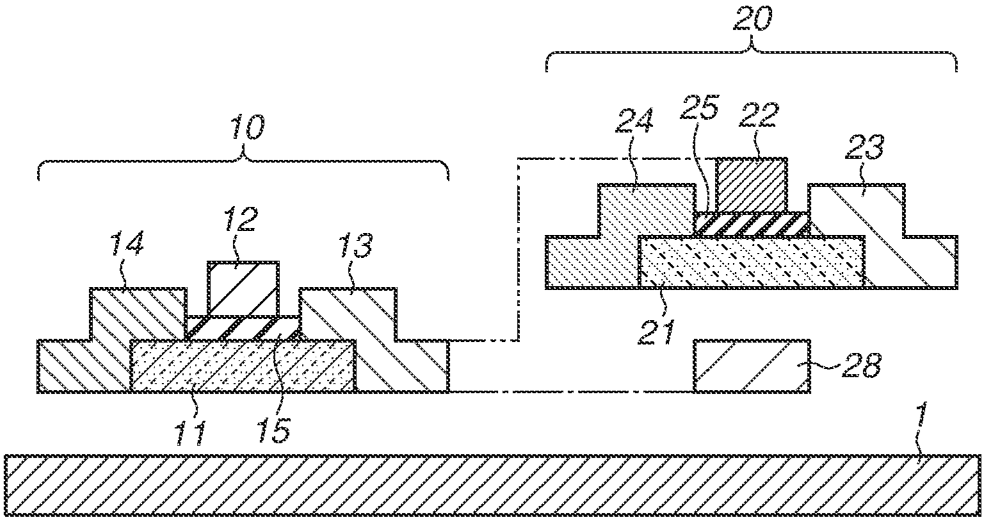
FIG. 4A is a schematic diagram illustrating the semiconductor apparatus.

FIG. 4A illustrates an example of a cross-sectional view of the semiconductor apparatus AP having the configuration of No. 02 in Table 1, using a dashed-dotted line in combination. The dashed-dotted line in FIG. 4A indicates a case where members connected by the dashed-dotted line are of the same layer. More specifically, the dashed-dotted line indicates a case where the source electrode 13 (and the drain electrode 14) is in the same layer as the conductor member 28.

FIG. 4A illustrates an example of a cross-sectional view of the semiconductor apparatus AP having the configuration of No. 01 in Table 1, using a dashed-two dotted line in combination. The dashed-two dotted line in FIG. 4A indicates a case where members connected by the dashed-two dotted line are of the same layer. More specifically, the dashed-two dotted line indicates a case where the source electrode 13 (and the drain electrode 14) is in the same layer as the gate electrode 22.

Figure 4B:
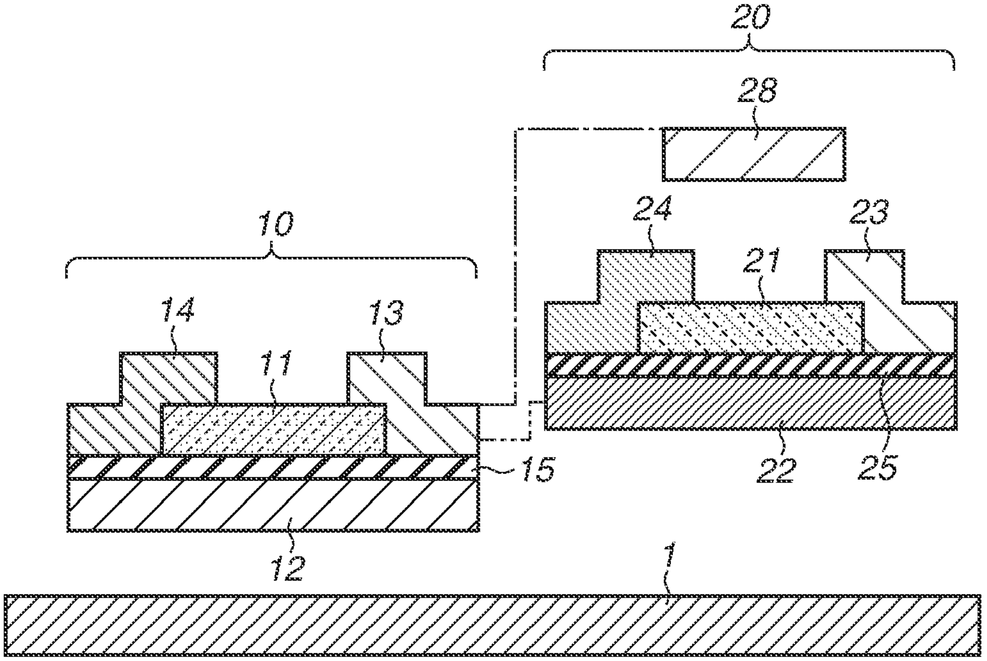
FIG. 4B is a schematic diagram illustrating the semiconductor apparatus.

FIG. 4B illustrates an example of a cross-sectional view of the semiconductor apparatus AP having the configuration of No. 32 in Table 1, using a dashed-dotted line in combination. The dashed-dotted line in FIG. 4B indicates that members connected by the dashed-dotted line are of the same layer. More specifically, the dashed-dotted line indicates a case where the source electrode 13 (and the drain electrode 14) is in the same layer as the conductor member 28.

FIG. 4B illustrates an example of a cross-sectional view of the semiconductor apparatus AP having the configuration of No. 31 in Table 1, using a dashed-two dotted line in combination. The dashed-two dotted line in FIG. 4B indicates a case where members connected by the dashed-two dotted line are of the same layer. More specifically, the dashed-two dotted line indicates a case where the source electrode 13 (and the drain electrode 14) is in the same layer as the gate electrode 22.

Figure 5A:
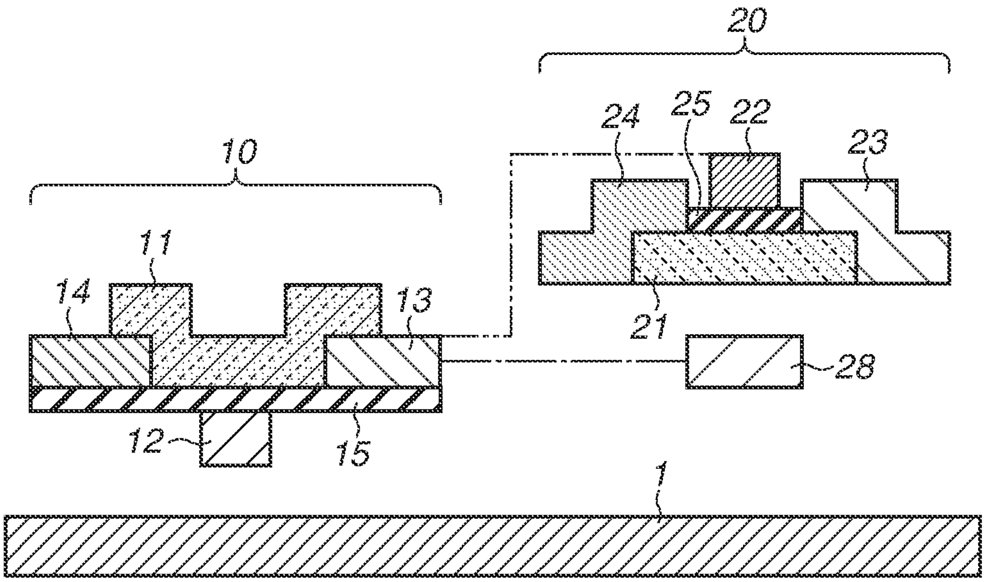
FIG. 5A is a schematic diagram illustrating the semiconductor apparatus.

FIG. 5A illustrates an example of a cross-sectional view of the semiconductor apparatus AP having the configuration of No. 08 in Table 1, using a dashed-dotted line in combination. The dashed-dotted line in FIG. 5A indicates that members connected by the dashed-dotted line are of the same layer. More specifically, the dashed-dotted line indicates that the source electrode 13 (and the drain electrode 14) is in the same layer as the conductor member 28.

FIG. 5A illustrates an example of a cross-sectional view of the semiconductor apparatus AP having the configuration of No. 07 in Table 1, using a dashed-two dotted line in combination. The dashed-two dotted line in FIG. 5A indicates a case where members connected by the dashed-two dotted line are of the same layer. More specifically, the dashed-two dotted line indicates a case where the source electrode 13 (and the drain electrode 14) is in the same layer as the gate electrode 22.

Figure 5B:
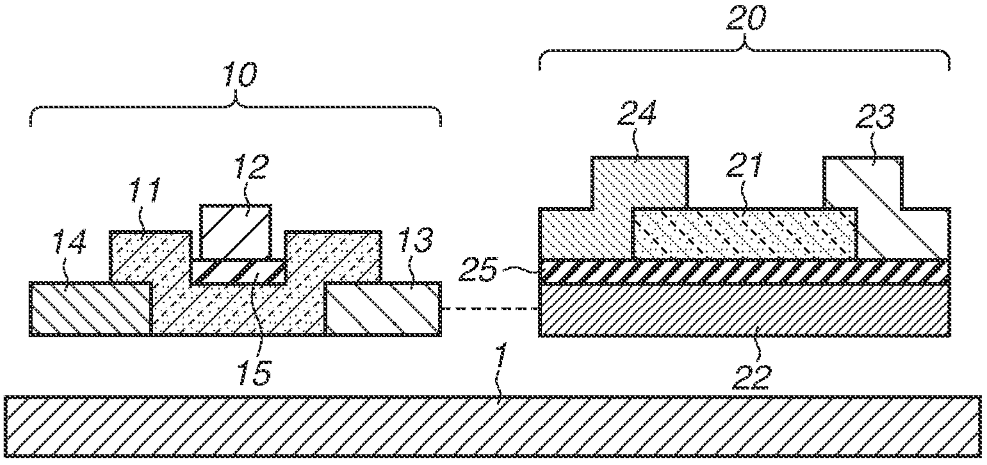
FIG. 5B is a schematic diagram illustrating the semiconductor apparatus.

FIG. 5B illustrates an example of a cross-sectional view of the semiconductor apparatus AP having the configuration of No. 27 in Table 1, using a dot-dash-line in combination. The dot-dash-line in FIG. 5B indicates that the source electrode 13 (and the drain electrode 14) is in the same layer as the gate electrode 22.

Figure 6A:
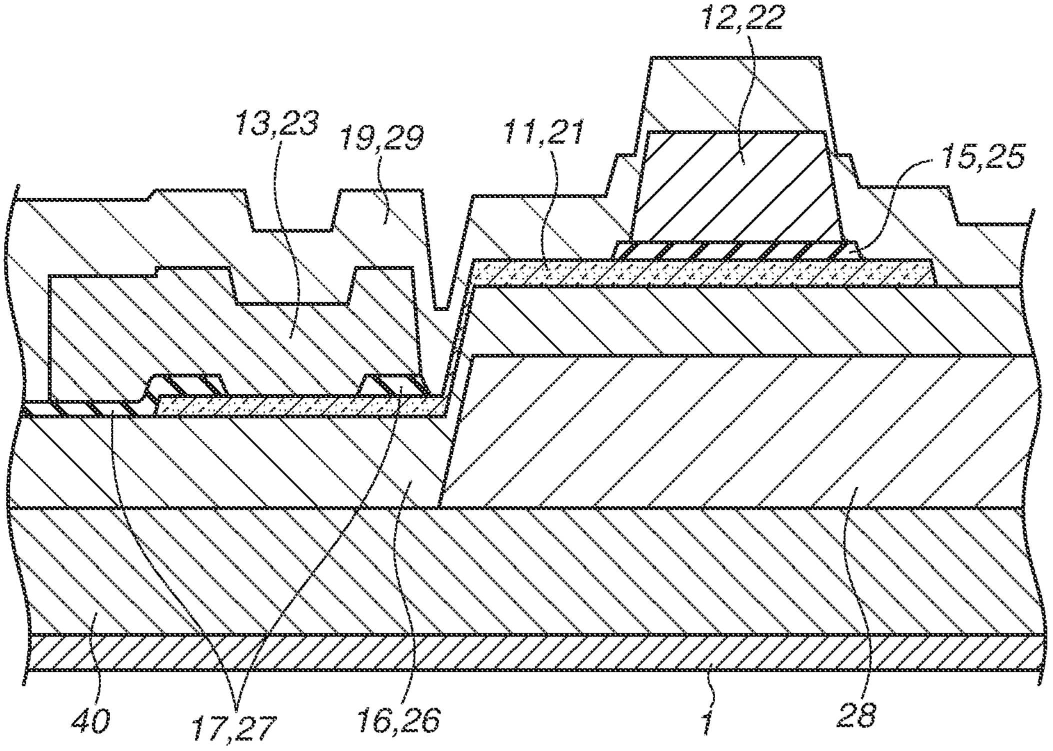
FIG. 6A is a schematic diagram illustrating the semiconductor apparatus.

FIG. 6A illustrates an example of a cross-sectional view of the T/C-type transistor illustrated in FIG. 2A. FIG. 6A illustrates size relations of thicknesses and distances between the layers. For example, in the transistor 20, the gate electrode 22, the source electrode 23, the drain electrode 24 have a thickness T1. The semiconductor layer 21 has a thickness T2 smaller than the thickness T1 (T1>T2). The gate insulating film 25 has a thickness T3 smaller than the thickness T1 (T1>T3). As illustrated in FIG. 6A, the thickness T3 may be smaller than the thickness T2 (T3<T2), but the thickness T3 may be larger than the thickness T2 (T3>T2). A distance between the conductor member 28 and the semiconductor layer 21 is larger than a distance between the gate electrode 22 and the semiconductor layer 21 (thickness of the gate insulating film 25). An interlayer insulating film 26 is disposed between the conductor member 28 and the semiconductor layer 21. An interlayer insulating film 27 is disposed between the semiconductor layer 21 and the source electrode 23. The interlayer insulating film 27 is in the same layer as the gate insulating film 25. An interlayer insulating film 29 is disposed and covers the transistor 20. The gate insulating film 25 has a portion extending outward from a region between the gate electrode 22 and the semiconductor layer 21 (portion not overlapping the gate electrode 22), and an interlayer insulating film 29 has a protruding portion reflecting the extending portion (portion not overlapping the gate electrode 22).

Such a structure of the transistor 20 illustrated in FIG. 6A can also be applied to the transistor 10. For example, in the transistor 10, an interlayer insulating film 16 is disposed below the semiconductor layer 11, an interlayer insulating film 17 is disposed on the semiconductor layer 11, and the semiconductor layer 11 is disposed between the interlayer insulating film 16 and the interlayer insulating layer 17. Then, the interlayer insulating film 19 is disposed and covers the transistor 10. The conductor member 28 needs not extend between the semiconductor layer 11 and the substrate 1. Any of the interlayer insulating films 16, 17, and 19 overlapping the transistor 10, and any of the interlayer insulating films 26, 27, and 29 overlapping the transistor 20 may be of the same layer. For example, the interlayer insulating film 19 and the interlayer insulating film 26 may be of the same layer. The interlayer insulating film 17 may correspond to the same layer as the gate insulating film 15. While the conductor member 28 is disposed between the semiconductor layer 21 and the substrate 1, an interlayer insulating film disposed between the conductor member 28 and the substrate 1 may be in the same layer as at least one of the interlayer insulating film 17 and the gate insulating film 15.

Figure 6B:
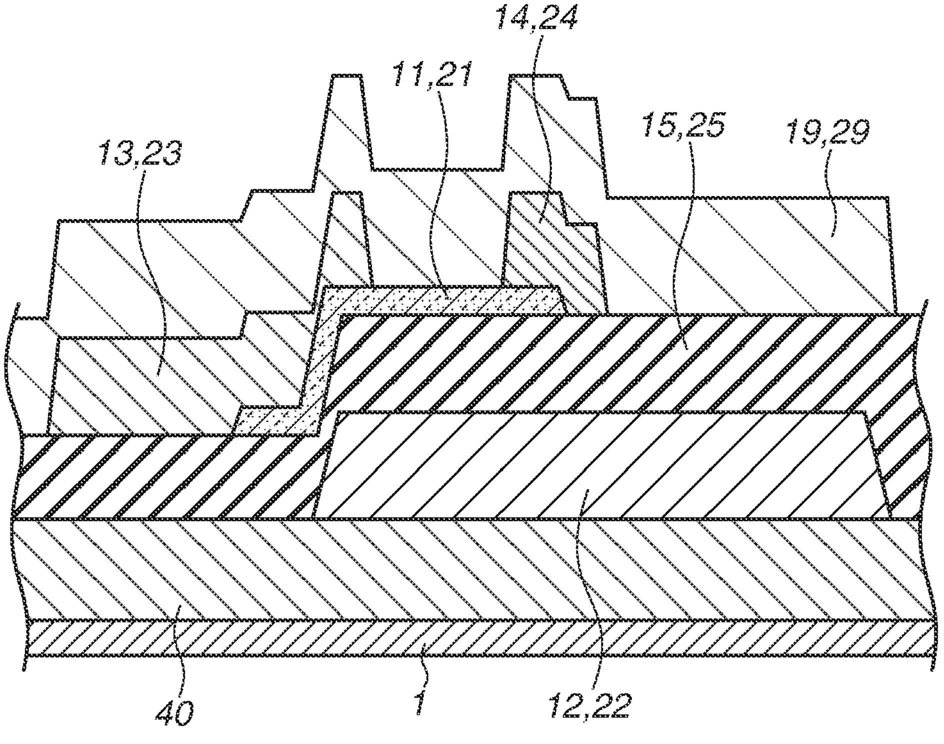
FIG. 6B is a schematic diagram illustrating the semiconductor apparatus.

FIG. 6B illustrates an example of a cross-sectional view of the B/S-type transistor illustrated in FIG. 2A. FIG. 6B illustrates size relations of thicknesses and distances between the layers. This example differs from that in FIG. 6A in that the gate insulating film 25 has a thickness T4 larger than the thickness T2 (T4>T2). In addition, in the transistor 10, the interlayer insulating film 16 is disposed below the semiconductor layer 11, and the interlayer insulating film 17 is disposed on the semiconductor layer 11, and the semiconductor layer 11 is disposed between the interlayer insulating film 16 and the interlayer insulating layer 17.

A manufacturing method of the semiconductor apparatus AP will be described with reference to FIGS. 7A to 7D.

Figure 7A:
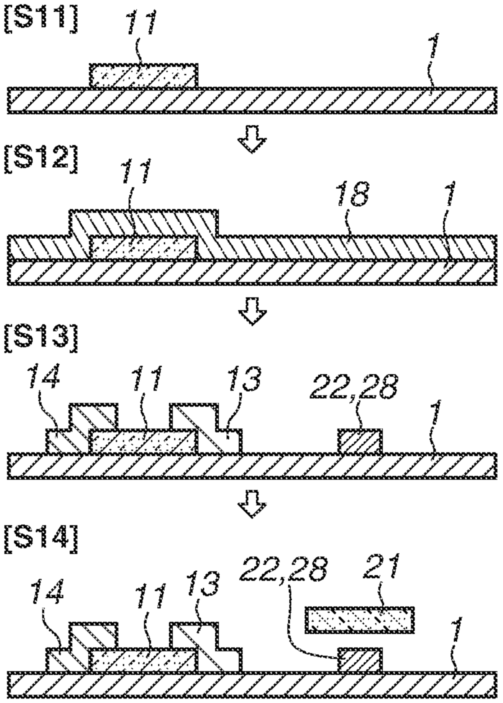
FIG. 7A is a schematic diagram illustrating a manufacturing method of the semiconductor apparatus.

FIG. 7A illustrates a first example of the manufacturing method. In the first example, in a process S11, the semiconductor layer 11 is formed on the substrate 1. In a process S12, a conductor film 18 covering the semiconductor layer 11 is formed on the substrate 1. In this process, the conductor film 18 is in contact with the semiconductor layer 11. In a process S13, patterning of the conductor film 18 is performed. While both wet etching and dry etching can be used for the patterning, wet etching is desirably used to reduce damage on the semiconductor layer 11. In the patterning, the source electrode 13 and the drain electrode 14 are formed from the conductor film 18. In addition, in the patterning, the gate electrode 22 or the conductor member 28 is formed from the conductor film 18. In a process S14, the semiconductor layer 21 insulated from the gate electrode 22 or the conductor member 28 is formed above the gate electrode 22 or the conductor member 28. In this manner, the gate electrode 22 or the conductor member 28 is formed in the same layer as the source electrode 13 and the drain electrode 14.

Figure 7B:
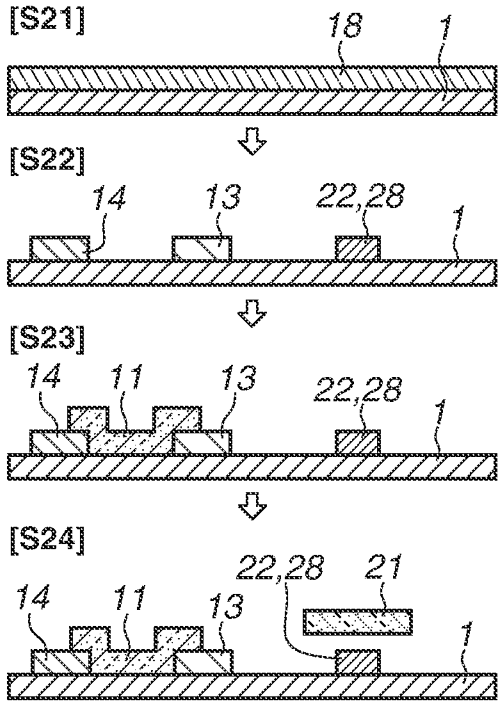
FIG. 7B is a schematic diagram illustrating the manufacturing method of the semiconductor apparatus.

FIG. 7B illustrates a second example of the manufacturing method. In the second example, in a process S21, the conductor film 18 is formed on the substrate 1. In a process S22, patterning of the conductor film 18 is performed. Both wet etching and dry etching can be used for the patterning. In the patterning, the source electrode 13 and the drain electrode 14 are formed from the conductor film 18. In addition, in the patterning, the gate electrode 22 or the conductor member 28 is formed from the conductor film 18. In a process S23, the semiconductor layer 11 covering the source electrode 13 and the drain electrode 14 is formed. In this process, the semiconductor layer 11 is in contact with the source electrode 13 and the drain electrode 14. In a process S24, the semiconductor layer 21 insulated from the gate electrode 22 or the conductor member 28 is formed above the gate electrode 22 or the conductor member 28. In this manner, the gate electrode 22 or the conductor member 28 is formed in the same layer as the source electrode 13 and the drain electrode 14.

Figure 7C:
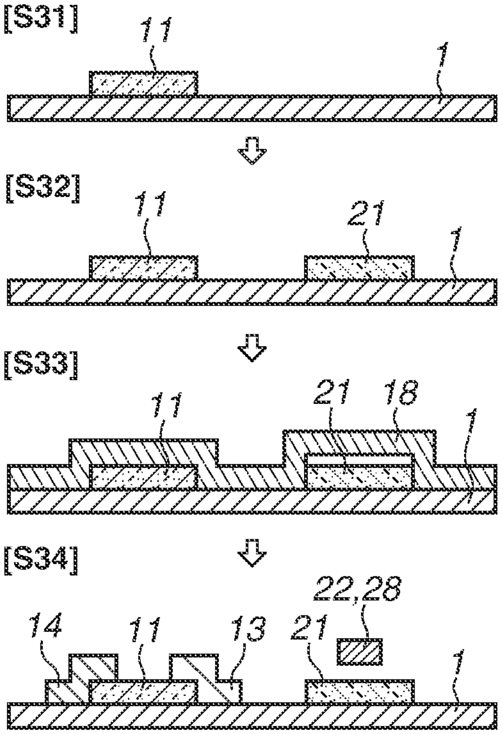
FIG. 7C is a schematic diagram illustrating the manufacturing method of the semiconductor apparatus.

FIG. 7C illustrates a third example of the manufacturing method. In the third example, in a process S31, the semiconductor layer 11 is formed on the substrate 1. In a process S32, the semiconductor layer 21 is formed on the substrate 1. In a process S33, the conductor film 18 covering the semiconductor layer 11 and the semiconductor layer 21 is formed on the substrate 1. In this process, the conductor film 18 is in contact with the semiconductor layer 11, and an insulating film is formed between a part of the conductor film 18 and the semiconductor layer 21. In a process S34, patterning of the conductor film 18 is performed. While both wet etching and dry etching can be used for the patterning, wet etching is desirably used to reduce damage on the semiconductor layers 11 and 21. In the patterning, the source electrode 13 and the drain electrode 14 are formed from the conductor film 18. In addition, by the patterning, the gate electrode 22 or the conductor member 28 is formed from the conductor film 18. With the insulating film formed in the process S34, the gate electrode 22 or the conductor member 28 is insulated from the semiconductor layer 21. In this manner, the gate electrode 22 or the conductor member 28 is formed in the same layer as the source electrode 13 and the drain electrode 14.

Figure 7D:
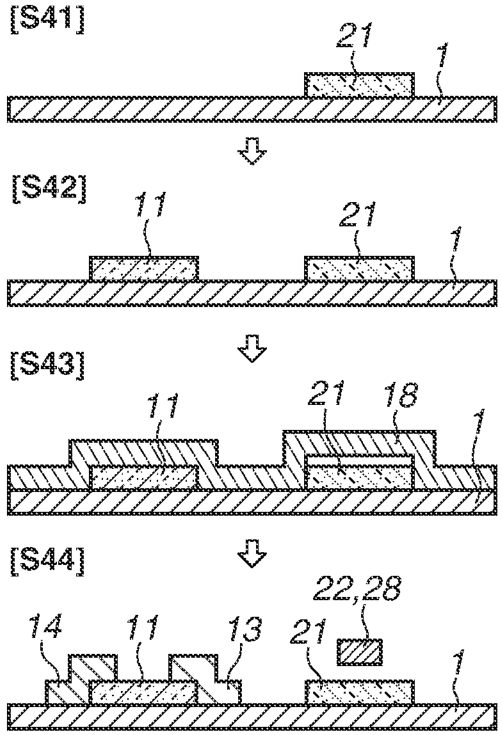
FIG. 7D is a schematic diagram illustrating the manufacturing method of the semiconductor apparatus.

FIG. 7D illustrates a fourth example of the manufacturing method. In the fourth example, in a process S41, the semiconductor layer 21 is formed on the substrate 1. In a process S42, the semiconductor layer 11 is formed on the substrate 1. In a process S43, the conductor film 18 covering the semiconductor layer 11 and the semiconductor layer 21 is formed on the substrate 1. In this process, the conductor film 18 is in contact with the semiconductor layer 11, and an insulating film is formed between a part of the conductor film 18 and the semiconductor layer 21. In a process S44, patterning of the conductor film 18 is performed. While both wet etching and dry etching can be used for the pattering, wet etching is desirably used to reduce damage on the semiconductor layers 11 and 21. In the patterning, the source electrode 13 and the drain electrode 14 are formed from the conductor film 18. In addition, in the patterning, the gate electrode 22 or the conductor member 28 is formed from the conductor film 18. With the insulating film formed in the process S44, the gate electrode 22 or the conductor member 28 is insulated from the semiconductor layer 21. In this manner, the gate electrode 22 or the conductor member 28 is formed in the same layer as the source electrode 13 and the drain electrode 14.

In the first example illustrated in FIG. 7A and the second example illustrated in FIG. 7B, since the conductor film 18 is formed before the semiconductor layer 21 is formed unevenness generated in the conductor film 18 can be reduced, in comparison with the third example illustrated in FIG. 7C and the fourth example illustrated in FIG. 7D in which the conductor film 18 is formed after the semiconductor layer 21 is formed. Thus, in the first example illustrated in FIG. 7A and the second example illustrated in FIG. 7B, the patterning of the conductor film 18 is able to be performed better than the third example illustrated in FIG. 7C and the fourth example illustrated in FIG. 7D.

In FIGS. 7A to 7D, the semiconductor layer 11 may be formed using a chemical vacuum deposition (CVD) method, the semiconductor layer 21 may be formed using a physical vapor deposition (PVD) method, the conductor film 18 may be formed using the PVD method, and the insulator film may be formed using the CVD method.

In an eleventh exemplary embodiment, a distance D1 between the semiconductor layer 11 and the substrate 1 may differ from a distance D2 between the semiconductor layer 21 and the substrate 1. The difference between the distance D1 and the distance D2 in the transistors 10 and 20 implements more appropriate characteristics of the transistors 10 and 20 in comparison with a case where the distance D1 and the distance D2 are equal to each other. The influence is exerted on the semiconductor layers 11 and 21 from the substrate 1, and the influence is exerted on the semiconductor layers 11 and 21 from a member existing on the opposite side of the side facing the substrate 1 with respect to the semiconductor layers 11 and 21. The difference between the distance D1 and the distance D2 in the transistors 10 and 20 implements more appropriate characteristics of the transistors 10 and 20.

In a twelfth exemplary embodiment, a distance D3 between the substrate 1 and the gate electrode 12 may differ from a distance D4 between the substrate 1 and the gate electrode 22. More specifically, the influence on the gate electrodes 12 and 22 from the substrate 1, the influence on the gate electrodes 12 and 22 from a member existing on the opposite side of the side facing the substrate 1 with respect to the gate electrodes 12 and 22, and the characteristics of the transistors 10 and 20 can be optimized.

The distance D3 between the substrate 1 and the gate electrode 12 may differ from the distance D2 between the substrate 1 and the semiconductor layer 21. In addition, the distance D4 between the substrate 1 and the gate electrode 22 may differ from the distance D1 between the substrate 1 and the semiconductor layer 11.

In a thirteenth exemplary embodiment, a distance D5 between the semiconductor layer 11 and the gate electrode 12 may differ from a distance D6 between the semiconductor layer 21 and the gate electrode 22. The distance D5 between the semiconductor layer 11 and the gate electrode 12 corresponds to the thickness of the gate insulating film 15, and the distance D6 between the semiconductor layer 21 and the gate electrode 22 corresponds to the thickness of the gate insulating film 25. The difference between the distance D5 and the distance D6 in the transistors 10 and 20 implements more appropriate characteristics of the transistors 10 and 20 more appropriate in comparison with a case where the distance D5 and the distance D6 are equal to each other.

In a case where a positional relationship between the substrate 1, the semiconductor layers 11 and 21, and the gate electrodes 12 and 22 varies in the transistors 10 and 20 as in the eleventh to thirteenth exemplary embodiments, unevenness is easily generated between the transistor 10 and the transistor 20. If conductor layers of the same layer are contiguous to each other between the transistor 10 and the transistor 20, due to the unevenness between the transistor 10 and the transistor 20, unexpected disconnection might occur between the conductor layers. It is thus desirable that the conductor layers of the same layer are noncontiguous to each other between the transistor 10 and the transistor 20. To electrically connect the noncontiguous conductor layers of the same layer, the conductor layers may be connected via another conductor layer. For example, in a case of electrically connecting the source electrode 13 (and the drain electrode 14) and the gate electrode 22 in the same layer and in a noncontiguous way, the electrodes may be connected via a conductor layer included in at least one of the gate electrode 12 and the source electrode 23 (the drain electrode 24).

In a fourteenth exemplary embodiment, the element S1 included in the semiconductor layer 11 may be an element of Group 14, and the element S2 included in the semiconductor layer 21 may be an element of Group 12, 13, 15, or 16. For example, the element S1 included in the semiconductor layer 11 may be silicone (S1), and the element S2 included in the semiconductor layer 21 may be oxygen (O). The semiconductor layer 11 may be a polycrystalline layer or a noncrystalline layer, and the semiconductor layer 21 may be an oxide semiconductor layer. The semiconductor layer 11 may be a polycrystal silicon layer. In the semiconductor layer 21, the element S4 may be indium (In). Using indium (In) as the element S4 results in increase in the mobility of the semiconductor layer 21. The semiconductor layer 21 may include gallium (Ga). The semiconductor layer 21 may include tin (Sn). In a case where the semiconductor layer 21 includes tin (Sn), the mobility of the semiconductor layer 21 is increased.

The substrate 1 may be an insulator substrate made of glass, resin, or the like, but can be a semiconductor substrate made of silicon or the like, or can be a conductor substrate made of metal or the like. In a case where the substrate 1 is a resin substrate, a base member in which a resin film made of polyimide or the like is formed on a base material, such as glass. is prepared, and the transistors 10 and 20 are formed on the resin film of the base member. After that, the base material and the resin film is separated using laser or the like, to use the resin film as the substrate 1 (resin substrate). The resin substrate may be a flexible substrate. In a case where the substrate 1 is a semiconductor substrate, at least either the semiconductor layer 11 or 21 may be a monocrystal semiconductor layer epitaxially grown on the substrate 1 being a monocrystal semiconductor, in accordance with a crystalline structure of the substrate 1. Alternatively, in a case where the substrate 1 is a semiconductor substrate, at least either the semiconductor layers 11 or 21 may have a structure (Semiconductor On Insulator (SOI) structure) of being formed via an insulator layer on the substrate 1 which is a monocrystal semiconductor. In a case where the substrate 1 is a conductor substrate, an insulator layer may be disposed between the semiconductor layer 11 or 21 and the substrate 1. The transistor 10 may be a P-type transistor or may be an N-type transistor. The transistor 10 desirably forms a CMOS circuit together with the transistor 30, and it is desirable that the transistor 10 is a P-type transistor and the transistor 30 is an N-type transistor. The transistor 10 may be an N-type transistor and the transistor 30 may be a P-type transistor. Among the elements of Groups 12 to 16 that are included in a semiconductor layer 31 of the transistor 30, an element with the highest concentration in the semiconductor layer 31 will be described as an element S5. The element S5 may be the same as the element S1 included in the semiconductor layer 11. Among the elements of Groups 12 to 16 that are included in the semiconductor layer 31 of the transistor 30, an element with the second highest concentration in the semiconductor layer 31 after the element S5 will be described as an element S6. The element S6 may differ from the element S3 included in the semiconductor layer 11. For example, the element S1 and the element S5 may be silicon (S1), the element S3 may be boron (B), and the element S6 may be phosphorus (P).

In a case where the transistor 10 is an N-type transistor and the transistor 30 is a P-type transistor, the element S3 may be phosphorus (P) and the element S6 may be boron (B). In a case where the semiconductor layer 11 of the transistor 10 and the semiconductor layer 31 of the transistor 30 are polycrystal semiconductor layers, the carrier mobility is increased, which is desirable to realize high speed switching. In a case where the semiconductor layer 11 of the transistor 10 and the semiconductor layer 31 of the transistor 30 are polycrystal semiconductor layers, carrier mobility is increased and thus a gate voltage is lowered, which is desirable to realize reduction in power consumption in comparison with a case of a noncrystalline semiconductor.

The transistor 20 may be a P-type transistor or may be an N-type transistor. Because an electron mobility is generally higher than a hole mobility, it is desirable that the transistor 20 is an N-type transistor. It is also desirable that the transistor 20 is a switch transistor. If the transistor 20 is an N-type switch transistor, high-speed switching is executable. In a case where the semiconductor layer 21 of the transistor 20 is an oxide semiconductor, a bandgap is widened and thus leak current of the switch transistor is reduced by a wide bandgap, which is desirable to realize reduction in leak current of the switch transistor.

The substrate 1 may have various sizes, but it is desirable that a diagonal length is more than or equal to 1 centimeter (cm), and it is also desirable that the diagonal length is more than or equal to 2.5 cm. In a case where the diagonal length is less than 2.5 cm, the semiconductor layer 11 of the transistor 10 may be a monocrystalline layer. For example, the transistor 10 may be formed on the substrate 1 made of monocrystal silicon, and the transistor 20 as a thin-film transistor may be formed on the substrate 1. The diagonal length of the substrate 1 may be more than or equal to 5 cm. In a case where the diagonal length of the substrate 1 is more than or equal to 5 cm, it is desirable that the transistor 10 is a thin-film transistor, and the semiconductor layer 11 may be a polycrystalline layer or a noncrystalline layer. In a case where the semiconductor layer 11 is a polycrystalline layer or a noncrystalline layer, even when the diagonal length of the substrate 1 is more than or equal to 5 cm, uniformity sufficient for the characteristics of the transistor 10 is ensured. In a case where the diagonal length of the substrate 1 is less than 75 cm, the semiconductor layer 11 of the transistor 10 is desirably a polycrystalline layer. In a case where the semiconductor layer 11 of the transistor 10 is a polycrystalline layer, the diagonal length of the substrate 1 may be more than or equal to 20 cm, may be more than or equal to 25 cm, and may be more than or equal to 30 cm. In a case where the diagonal length of the substrate 1 is more than or equal to 20 cm, it is desirable that the transistor 10 in which a polycrystalline layer is used as the semiconductor layer 11 is disposed in the pixel circuit PX. In a case where a polycrystalline layer with a high charge mobility is used for the amplifier transistor 104 and the drive transistor 106 of the pixel circuit PX, even in the substrate 1 with a large diagonal length, power consumption in the power line PL connecting to the pixel circuit PX is reduced. In a case where the transistor 10 is disposed in the pixel circuit PX, from the viewpoint of image quality improvement, it is desirable that the diagonal length of the substrate 1 is less than 50 cm. In a case where the diagonal length of the substrate 1 is less than 50 cm, uniformity sufficient for the characteristics of the transistor 10 is ensured. In a case where the diagonal length of the substrate 1 is more than or equal to 75 cm, it is desirable that the semiconductor layer 11 of the transistor 10 is a noncrystalline layer. Whichever diagonal length the substrate 1 has, it is desirable that the semiconductor layer 21 of the transistor 20 is an oxide semiconductor layer.

While the diagonal length of the substrate 1 has been described, the same applies to the diagonal length of the pixel region 2, and the diagonal length of the substrate 1 may be read as the diagonal length of the pixel region 2. For example, it is desirable that the diagonal length of the pixel region 2 is more than or equal to 1 cm, it is also desirable that the diagonal length of the pixel region 2 is more than or equal to 2.5 cm, it is also desirable that the diagonal length of the pixel region 2 is more than or equal to 5 cm, and the diagonal length of the pixel region 2 may be more than or equal to 20 cm, more than or equal to 25 cm, more than or equal to 30 cm, or may be less than 75 cm.

A fifteenth exemplary embodiment is an exemplary embodiment obtained by combining the eleventh exemplary embodiment and the fourteenth exemplary embodiment, and it is desirable that the distance D1 between the semiconductor layer 11 and the substrate 1 is smaller than the distance D2 between the semiconductor layer 21 and the substrate 1. In a case where the semiconductor layer 11 is a polycrystalline layer, crystallinity control is important. In a case where the semiconductor layer 11 is disposed more closely to the substrate 1 than the semiconductor layer 21, the flatness of the semiconductor layer 11 is improved, which improves the uniformity of crystallinity. In addition, in a case where the semiconductor layer 11 is formed earlier than the semiconductor layer 21, the influence of heat treatment for forming the semiconductor layer 11 is prevented from being exerted on the semiconductor layer 21. That is, before the semiconductor layer 21 is formed, appropriate heat treatment is able to be performed on the semiconductor layer 11. Thus, the crystallinity control of the semiconductor layer 11 is easier.

A sixteenth exemplary embodiment is an exemplary embodiment obtained by combining the twelfth exemplary embodiment and the fourteenth exemplary embodiment, and it is desirable that the distance D3 between the substrate 1 and the gate electrode 12 is smaller than the distance D4 between the substrate 1 and the gate electrode 22.

A seventeenth exemplary embodiment is an exemplary embodiment obtained by combining the twelfth exemplary embodiment and the fifteenth exemplary embodiment, and it is desirable that the distance D5 between the semiconductor layer 11 and the gate electrode 12 is smaller than the distance D6 between the semiconductor layer 21 and the gate electrode 22. The distance D5 between the semiconductor layer 11 and the gate electrode 12 corresponds to the thickness of the gate insulating film 15, and the distance D6 between the semiconductor layer 21 and the gate electrode 22 corresponds to the thickness of the gate insulating film 25. For example, the distance D5 may be 200 to 400 nanometers (nm) and the distance D6 may be 50 to 200 nm. Thinning the gate insulating film 15 improves the response characteristics of the transistor 10, which realizes good drive force. In addition, thickening the gate insulating film 25 further reduces leak current of the transistor 20.

Figure 8:
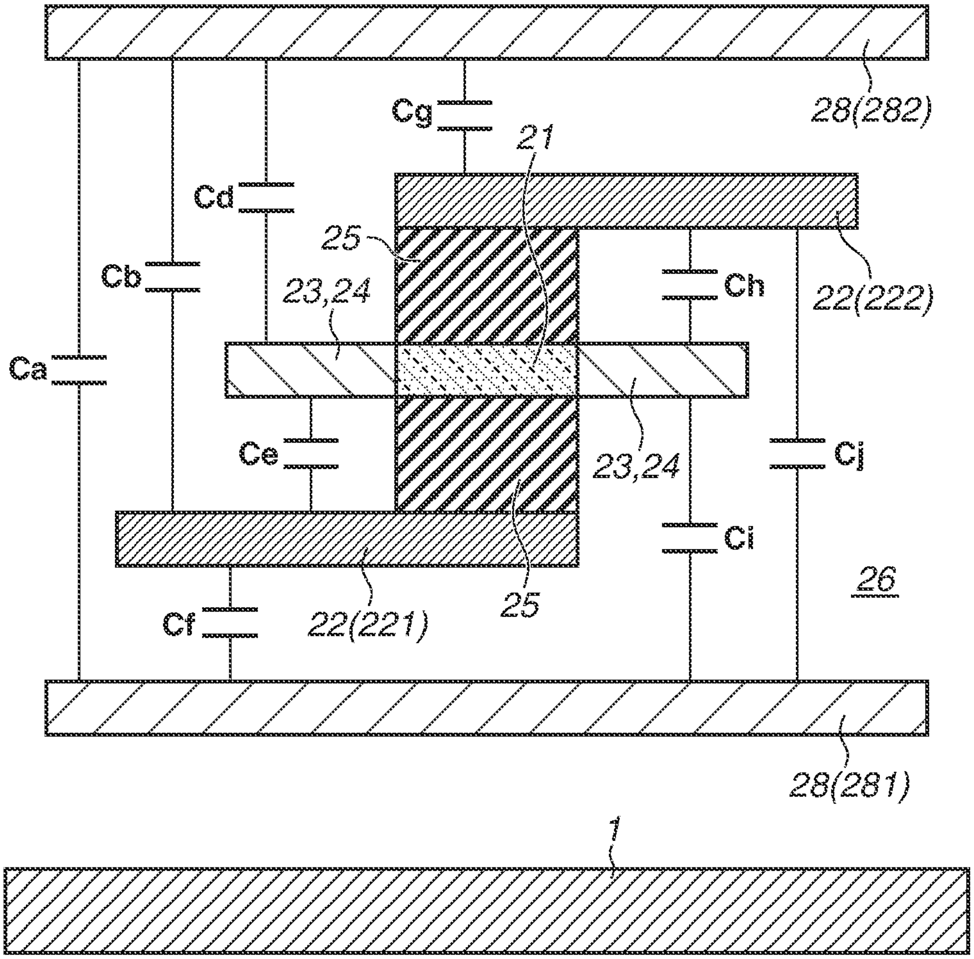
FIG. 8 is a schematic diagram illustrating the semiconductor apparatus.

An eighteenth exemplary embodiment is related to a capacitor C disposed on the substrate 1. While the capacitor C is able to be applied to the capacitors 103 and 108 illustrated in FIGS. 1C and 1D, respectively, for example, the capacitor C is not limited to a capacitor in the pixel circuit PX, and is also be usable in an integrated circuit of the peripheral region 3. As illustrated in FIG. 8, at least one of a lower gate electrode 221 and an upper gate electrode 222 is disposed above the substrate 1 as the gate electrode 22 overlapping the semiconductor layer 21. For convenience in description, FIG. 8 illustrates both of the lower gate electrode 221 and the upper gate electrode 222, but one of the gate electrodes can be omitted.

The lower gate electrode 221 is disposed on a side with the substrate 1 with respect to the semiconductor layer 21, and the lower gate electrode 221 is between the semiconductor layer 21 and the substrate 1. The lower gate electrode 221 corresponds to the gate electrode 22 in the B-type transistor 20 illustrated in FIGS. 2B, 2C, 3B, 4B, 5B, and 6B.

The upper gate electrode 222 is disposed on a side opposite to the side with the substrate 1 with respect to the semiconductor layer 21, and the semiconductor layer 21 is between the upper gate electrode 222 and the substrate 1. The upper gate electrode 222 corresponds to the gate electrode 22 in the T-type transistor 20 illustrated in FIGS. 2A, 2D, 3A, 4A, 5A, and 6A. The lower gate electrode 221 and/or the upper gate electrode 222 overlap(s) the semiconductor layer 21, and the gate insulating film 25 is disposed between the lower gate electrode 221 and the semiconductor layer 21 and/or between the upper gate electrode 222 and the semiconductor layer 21.

The lower gate electrode 221 may overlap either the source electrode 23 or the drain electrode 24. Thus, the lower gate electrode 221 forms a capacitor Ce together with the source electrode 23 or the drain electrode 24. The upper gate electrode 222 may overlap either the source electrode 23 or the drain electrode 24. Thus, the lower gate electrode 221 forms a capacitor Ch together with the source electrode 23 or the drain electrode 24. In this manner, each of the capacitors Ce and Ch is an MIM-type capacitor in which a dielectric layer is between a conductor layer and another conductor layer.

Especially in a case where both of the lower gate electrode 221 and the upper gate electrode 222 are disposed, the potential of the lower gate electrode 221 can be the same as the potential of the upper gate electrode 222. To achieve this, the lower gate electrode 221 and the upper gate electrode 222 can be electrically connected with each other. A conductor layer of the lower gate electrode 221 and a conductor layer of the upper gate electrode 222 can be in contact with each other, or both conductor layers can be electrically connected with each other via another conductor layer (for example, via).

It is desirable that the element M2 in at least one of the conductor layer of the lower gate electrode 221 and the conductor layer the upper gate electrode 222 is the same as the element M1 in at least one of the conductor layer of the source electrode 13 and conductor layer of the drain electrode 14. In addition, it is also desirable that either the conductor layer of the lower gate electrode 221 or the conductor layer the upper gate electrode 222 that includes the element M2 is of the same layer as at least one of the conductor layer of the source electrode 13 and the conductor layer of the drain electrode 14 that includes the element M1.

A nineteenth exemplary embodiment is also related to the capacitor C disposed on the substrate 1. While the capacitor C is applicable to the capacitors 103 and 108 illustrated in FIGS. 1C and 1D, respectively, for example, the capacitor is not limited to a capacitor in the pixel circuit PX, and is also able to be used in an integrated circuit of the peripheral region 3. The description of points similar to those in the eighteenth exemplary embodiment will be omitted. As illustrated in FIG. 8, at least one of a lower capacitor electrode 281 and an upper capacitor electrode 282 is disposed above the substrate 1 as the conductor member 28. For convenience of description, FIG. 8 illustrates both of the lower capacitor electrode 281 and the upper capacitor electrode 282, but one of the capacitor electrodes may be omitted, or both the lower capacitor electrode 281 and the upper capacitor electrode 282 may be omitted.

The lower capacitor electrode 281 overlaps at least any of the lower gate electrode 221, the source electrode 23, the drain electrode 24, the upper gate electrode 222, and the upper capacitor electrode 282. The lower capacitor electrode 281 is disposed between an electrode overlapping the lower capacitor electrode 281 and the substrate 1.

The lower capacitor electrode 281, and at least any of electrodes overlapping the lower capacitor electrode 281 form an MIM-type capacitor in which a dielectric layer is between a conductor layer and another conductor layer. In this example, the dielectric layer of the capacitor is the interlayer insulating film 26. For example, the lower capacitor electrode 281 forms a capacitor Cf together with the lower gate electrode 221. For example, the lower capacitor electrode 281 forms a capacitor Ci together with the source electrode 23 or the drain electrode 24. For example, the lower capacitor electrode 281 forms a capacitor Cj together with the upper gate electrode 222. For example, the lower capacitor electrode 281 forms a capacitor Ca together with the upper capacitor electrode 282.

The upper capacitor electrode 282 overlaps at least any of the lower capacitor electrode 281, the lower gate electrode 221, the source electrode 23, the drain electrode 24, and the upper gate electrode 222. An electrode overlapping the upper capacitor electrode 282 is between the upper capacitor electrode 282 and the substrate 1.

The upper capacitor electrode 282 and at least any of electrodes overlapping the upper capacitor electrode 282 form an MIM-type capacitor in which a dielectric layer is between a conductor layer and another conductor layer. In this example, the dielectric layer of the capacitor is the interlayer insulating film 26. For example, the upper capacitor electrode 282 forms the capacitor Ca together with the lower capacitor electrode 281. For example, the upper capacitor electrode 282 forms a capacitor Cb together with the lower gate electrode 221. For example, the upper capacitor electrode 282 forms a capacitor Cd together with the source electrode 23 or the drain electrode 24. For example, the upper capacitor electrode 282 forms a capacitor Cg together with the upper gate electrode 222.

In the example illustrated in FIG. 8, the lower capacitor electrode 281 and the upper capacitor electrode 282 overlap the semiconductor layer 21 has been described. The lower capacitor electrode 281 is between the semiconductor layer 21 and the substrate 1. In addition, the semiconductor layer 21 is between the upper capacitor electrode 282 and the substrate 1. As long as the lower capacitor electrode 281 and the upper capacitor electrode 282 overlap a counterpart electrode with which a capacitor is formed, a configuration in which the lower capacitor electrode 281 and the upper capacitor electrode 282 do not overlap the semiconductor layer 21 may be employed.

It is desirable that the element M5 in at least one of the conductor layer of the lower capacitor electrode 281 and the conductor layer of the upper capacitor electrode 282 is the same as the element M1 in at least one of the conductor layer of the source electrode 13 and the conductor layer of the drain electrode 14. In addition, it is desirable that either the conductor layer of the lower capacitor electrode 281 or the conductor layer of the upper capacitor electrode 282 that includes the element M5 is of the same layer as at least one of the conductor layer of the source electrode 13 and the conductor layer of the drain electrode 14 that includes the element M1.

In the eighteenth and nineteenth exemplary embodiments, at least one of two electrodes forming the capacitor C is the gate electrode 22 or the conductor member 28 (capacitor electrode) in no contact with the semiconductor layer 21. The other one of the two electrodes forming the capacitor C is the gate electrode 22 or the conductor member 28 (capacitor electrode) in no contact with the semiconductor layer 21, or the source electrode 13 or the drain electrode 14 in contact with the semiconductor layer 21. Then, out of the two electrodes forming the capacitor C, an electrode (the gate electrode 22 or the conductor member 28 (capacitor electrode)) in no contact with the semiconductor layer 21 is insulated with a dielectric layer (the interlayer insulating film 26) from the other electrode of the two electrodes forming the capacitor C.

The capacitors 103 and 108 illustrated in FIGS. 1C and 1D, respectively, are connected to a source or a drain of the reset transistor 102 serving as the transistor 20, a source or a drain of the selection transistor 107, and a source or a drain of the drive transistor 106. In connecting, an electrode of a capacitor electrically connected to the semiconductor layers 11 and 21 of the transistors 10 and 20 can be indirectly connected to the semiconductor layers 11 and 21 via another conductor layer (via, etc.) in such a manner as not to be in contact with the semiconductor layers 11 and 21. In this configuration, it is possible to prevent metal contamination of the semiconductor layers 11 and 21. Especially in a case where the elements M1 to M5 are easily-diffusible copper (Cu), it is desirable to prevent a conductor layer (copper layer) made of copper from being in contact with the semiconductor layers 11 and 21.

In the examples illustrated in FIGS. 4A, 5A, and 6A, the gate electrode 22 may correspond to the upper gate electrode 222 illustrated in FIG. 8, and the conductor member 28 may correspond to the lower capacitor electrode 281 illustrated in FIG. 8. Then, the gate electrode 22 and the conductor member 28 may form the capacitor Cj illustrated in FIG. 8. The capacitor Cj may be used as the capacitors 103 and 108 illustrated in FIG. 1C or 1D, for example.

In the example illustrated in FIG. 4B, the gate electrode 22 may correspond to the lower gate electrode 221 illustrated in FIG. 8, and the conductor member 28 may correspond to the upper capacitor electrode 282 illustrated in FIG. 8. Then, the gate electrode 22 and the conductor member 28 may form the capacitor Cb illustrated in FIG. 8. The capacitor Cb may be used as the capacitors 103 and 108 illustrated in FIG. 1C or 1D, for example.

Figure 9A:
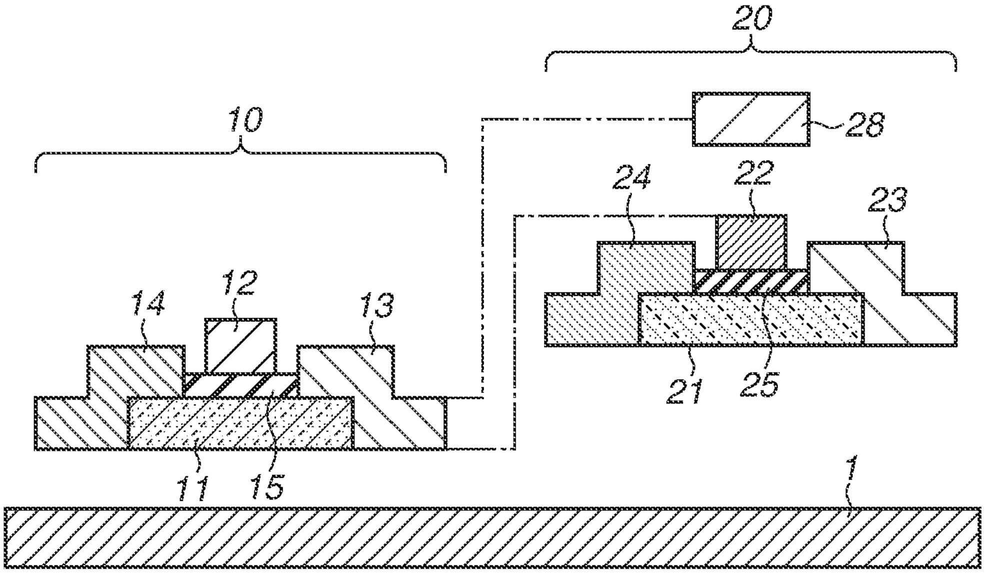
FIG. 9A is a schematic diagram illustrating the semiconductor apparatus.

FIG. 9A illustrates an example of a cross-sectional view of the semiconductor apparatus AP having the configuration of No. 01 in Table 1, using a dashed-dotted line in combination. The dashed-dotted line in FIG. 9A indicates that members connected by the dashed-dotted line are of the same layer. More specifically, the dashed-dotted line indicates that the source electrode 13 (and the drain electrode 14) is in the same layer as the gate electrode 22.

FIG. 9A illustrates an example of a cross-sectional view of the semiconductor apparatus AP having the configuration of No. 02 in Table 1, using a dashed-two dotted line in combination. The dashed-two dotted line in FIG. 9A indicates a case where members connected by the dashed-two dotted line are of the same layer. More specifically, the dashed-two dotted line indicates a case where the source electrode 13 (and the drain electrode 14) is in the same layer as the conductor member 28.

In the example illustrated in FIG. 9A, the gate electrode 22 corresponds to the upper gate electrode 222 illustrated in FIG. 8, and the conductor member 28 corresponds to the upper capacitor electrode 282 illustrated in FIG. 8. Then, the gate electrode 22 and the conductor member 28 form the capacitor Cg illustrated in FIG. 8. The capacitor Cg can be used as the capacitors 103 and 108 illustrated in FIG. 1C or 1D, for example.

Figure 9B:
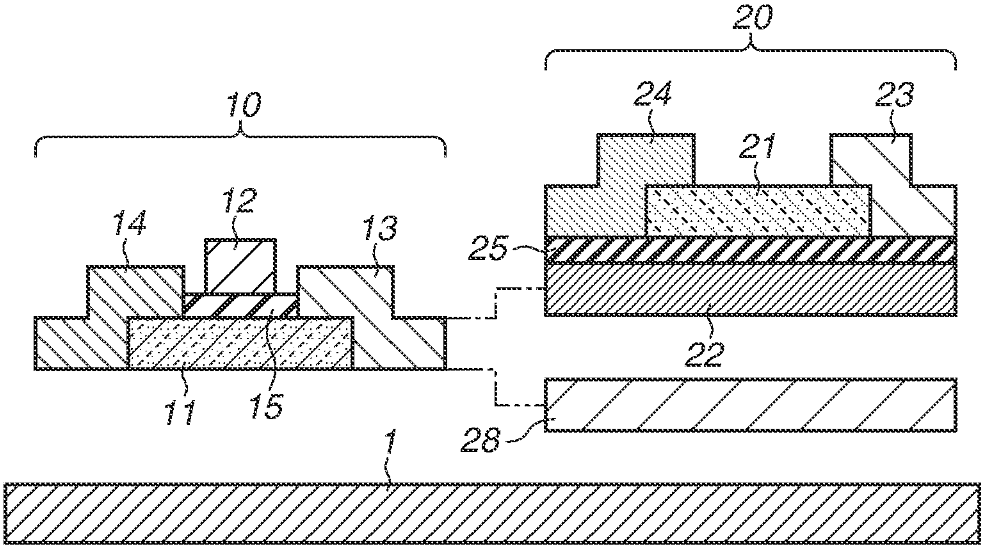
FIG. 9BA is a schematic diagram illustrating the semiconductor apparatus.

FIG. 9B illustrates an example of a cross-sectional view of the semiconductor apparatus AP having the configuration of No. 17 in Table 1, using a dashed-dotted line in combination. The dashed-dotted line in FIG. 9B indicates that members connected by the dashed-dotted line are of the same layer. More specifically, the dashed-dotted line indicates that the source electrode 13 (and the drain electrode 14) is in the same layer as the gate electrode 22.

FIG. 9B illustrates an example of a cross-sectional view of the semiconductor apparatus AP having the configuration of No. 18 in Table 1, using a dashed-two dotted line in combination. The dashed-two dotted line in FIG. 9B indicates a case where members connected by the dashed-two dotted line are of the same layer. More specifically, the dashed-two dotted line indicates a case where the source electrode 13 (and the drain electrode 14) is in the same layer as the conductor member 28.

In the example illustrated in FIG. 9B, the gate electrode 22 corresponds to the lower gate electrode 221 illustrated in FIG. 8, and the conductor member 28 corresponds to the lower capacitor electrode 281 illustrated in FIG. 8. Then, the gate electrode 22 and the conductor member 28 form the capacitor Cf illustrated in FIG. 8. The capacitor Cf may be used as the capacitors 103 and 108 illustrated in FIG. 1C or 1D, for example.

Also in FIGS. 3A to 9B, the insulator 40 as illustrated in FIG. 1B is disposed on the substrate 1, and an insulator film, such as an interlayer insulating film or a gate insulating film, that is included the insulator 40 is disposed around the semiconductor layer 11 or 21. In FIGS. 3A to 9B, the illustration of at least part of these insulators 40 is omitted.

Figure 10A:
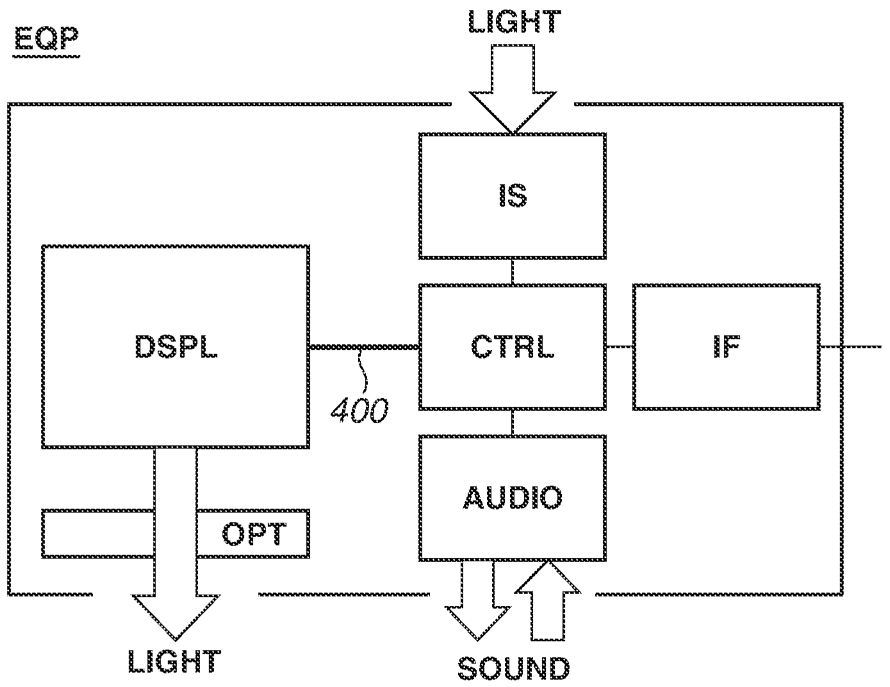
FIG. 10A is a schematic diagram illustrating equipment.

FIG. 10A illustrates equipment EQP including the semiconductor apparatus AP. The equipment EQP may include at least any of a display apparatus DSPL, an imaging apparatus IS, an audio apparatus AUDIO, a control apparatus CTRL, and a communication apparatus IF. Typically, either the display apparatus DSPL or the imaging apparatus IS has the above-described structure of the semiconductor apparatus AP. The audio apparatus AUDIO, the control apparatus CTRL, and the communication apparatus IF may have the above-described structure of the semiconductor apparatus AP. The audio apparatus AUDIO includes a microphone and a speaker. The communication apparatus IF performs cable communication or wireless communication. The communication apparatus IF may perform communication in a frequency band of 3.5 to 5.0 gigahertz (GHz), and may perform communication in a frequency band of 24 to 53 GHz. The communication apparatus IF may perform communication using terahertz waves in addition to microwaves and milliwaves. The control apparatus CTRL may include a wiring board and a plurality of components mounted on the wiring board. The control apparatus CTRL may include a semiconductor device manufactured in 65 to 5 nm process, or may include a semiconductor device manufactured in 1 to 4 nm process. In manufacturing of these semiconductor devices, it is sufficient that an extreme ultraviolet (EUV) exposure apparatus, an electron beam exposure apparatus, a nanoimprint lithography apparatus, or the like is used.

The control apparatus CTRL is connected to the display apparatus DSPL. In a case where the display apparatus DSPL includes a drive circuit for driving a pixel circuit in the peripheral region 3, the control apparatus CTRL can supply power and signals to the drive circuit. In a case where the display apparatus DSPL does not include a drive circuit for driving a pixel circuit in the peripheral region 3, the control apparatus CTRL includes a drive circuit for driving a pixel circuit.

The control apparatus CTRL is connected to the imaging apparatus IS. The control apparatus CTRL controls an image capturing mode of the imaging apparatus IS, and process a signal output from the imaging apparatus IS. The imaging apparatus IS may be an image sensor, or may be an infrared sensor or a ranging sensor.

The equipment EQP may include an optical member OPT disposed above the display apparatus DSPL that is the semiconductor apparatus AP. The optical member OPT is a lens, a cover, or a filter. In a case where the semiconductor apparatus AP is the display apparatus DSPL of a top emission type, the semiconductor layer 21 may be disposed between the substrate 1 of the semiconductor apparatus AP and the optical member OPT. In a case where the semiconductor apparatus AP is the display apparatus DSPL of a bottom emission type, the substrate 1 may be disposed between the semiconductor layer 21 of the semiconductor apparatus AP and the optical member OPT.

The equipment EQP may include the imaging apparatus IS and the display apparatus DSPL. An image captured by the imaging apparatus IS may be displayed on a display apparatus DSPL.

The display apparatus DSPL may be able to switch a frame rate at which the display apparatus DSPL performs display, between a low frame rate and a high frame rate higher than the low frame rate. For example, the low frame rate is less than or equal to frames per second (fps), or is less than or equal to 5 fps, or is 1 fps, for example. For example, the high frame rate is more than or equal to 100 fps, or is more than or equal to 200 fps, or is 240 fps, for example. The display apparatus DSPL may be able to switch a refresh rate at which the display apparatus DSPL performs display, between a low refresh rate and a high refresh rate higher than the low refresh rate. For example, the low refresh rate is less than or equal to 10 hertz (Hz), or is less than or equal to 5 Hz, or is 1 Hz, for example. For example, the high refresh rate is less than or equal to 100 Hz, or is more than or equal to 200 Hz, or is 240 Hz, for example. Both the frame rate unit (fps) and the refresh rate unit (Hz) can be represented as "frames per second" or "times per second". The display apparatus DSPL may able to switch a frame rate at which the display apparatus DSPL performs display, to a medium frame rate between the low frame rate and the high frame rate. For example, the medium frame rate is 20 to 80 fps. The display apparatus DSPL may able to switch a refresh rate at which the display apparatus DSPL performs display, to a medium refresh rate between the low refresh rate and the high refresh rate. For example, the medium refresh rate is 20 to 80 Hz. Since an oxide semiconductor layer has a small leak current, in a case where an oxide semiconductor layer is used in the selection transistor 107, charge leakage from the capacitor 108 is suppressed, whereby driving at the low frame rate is easily performed. In addition, since a polycrystal semiconductor layer has a higher mobility than that of a noncrystalline semiconductor layer, in a case where a polycrystal semiconductor layer is used in the selection transistor 107, selection speed is increased, whereby driving at the high frame rate and refresh rate is easily performed. In addition, since a polycrystal semiconductor layer has a higher mobility than that of a noncrystalline semiconductor layer, in a case where a polycrystal semiconductor layer is used in the drive transistor 106, lowering of a gate voltage is realized, whereby driving with low power consumption is easily performed.

The imaging apparatus IS may perform image capturing at the above-described medium frame rate between the low frame rate and the high frame rate. The imaging apparatus IS may perform image capturing at the above-described medium frame rate between the low refresh rate and the high refresh rate. For example, the imaging apparatus IS may perform image capturing at a frame rate of 20 to 80 fps. The image capturing here is not limited to storing images, and also includes image capturing for only performing temporal display, such as live view. It is desirable that a frame rate of the display apparatus DSPL that is to be set when an image captured by the imaging apparatus IS at the medium frame rate is to be displayed is the medium frame rate or the high frame rate. It is desirable that a refresh rate of the display apparatus DSPL that is to be set when an image captured by the imaging apparatus IS at the medium frame rate is to be displayed is the medium refresh rate or the high refresh rate. For example, it is desirable that a refresh rate of the display apparatus DSPL that is to be set when an image captured by the imaging apparatus IS at the frame rate of 30 frames per second is to be displayed is 60 frames per second or 120 frames per second.

Figure 10B:
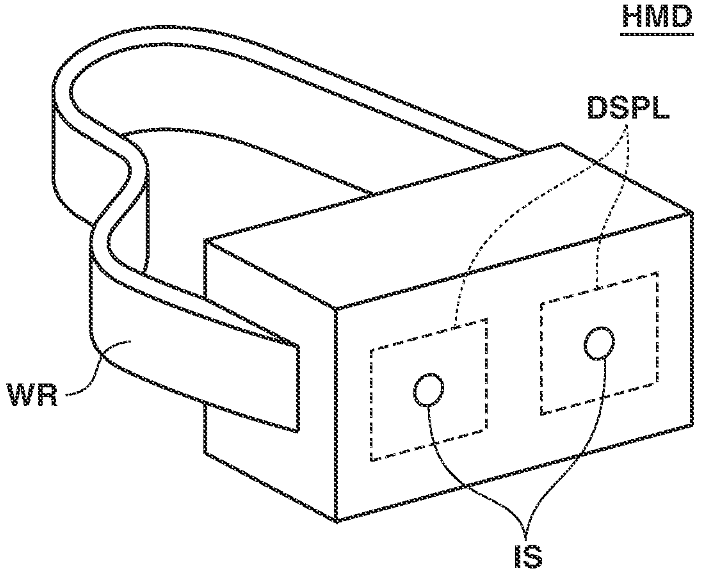
FIG. 10B is a schematic diagram illustrating the equipment.

The equipment EQP can be electronic equipment, such as a smartphone, a tablet terminal, a lap-top personal computer, a digital camera, or a wearable terminal. The equipment EQP can include a battery, such as a lithium ion battery, a solid-state battery, or a fuel battery. Since power to be consumed by the imaging apparatus IS and the display apparatus DSPL is able to be decreased, long driving time using the battery is realized. FIG. 10B illustrates a head-mounted display HMD serving as a wearable terminal. A main body including the display apparatus DSPL and the imaging apparatus IS is attachable to a head using a wearing unit WR. Aside from the above-described electronic equipment, the present invention can be applied to various equipment, such as transport equipment, industrial equipment, medical equipment, and analysis equipment.

The exemplary embodiments described above can be appropriately changed without departing from the technical idea. For example, a plurality of exemplary embodiments can be combined. In addition, part of the configurations described in at least one exemplary embodiment can be deleted or replaced. In addition, a new configuration can be added to at least one exemplary embodiment.

The disclosure of this specification is not limited to the matters explicitly described in this specification, and includes all matters identifiable from this specification and the drawings accompanying this specification. The disclosure of this specification includes a complement set of individual concepts described in this specification. More specifically, for example, if "A is larger than B" is described in this specification, even if the description of "A is not larger than B" is omitted, this specification can be said to disclose that "A is not larger than B". This is because, in a case where "A is larger than B" is described, a case where "A is not larger than B" is considered.

The present invention is not limited to the above-described exemplary embodiments, and various changes and modifications can be made without departing from the spirit and the scope of the present invention. Accordingly, to publicize the scope of the present invention, the following claims are appended.

According to the present invention, a technique advantageous in reducing cost of a semiconductor apparatus can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A semiconductor apparatus comprising:

a substrate;

a first semiconductor layer that is of a first transistor and disposed above the substrate;

a first electrode disposed above the substrate and overlapping the first semiconductor layer, the first electrode including a first conductor layer;

a second semiconductor layer that is of a second transistor and disposed above the substrate; and a second electrode disposed above the substrate and overlapping the second semiconductor layer, the second electrode including a second conductor layer, wherein a first element with a highest concentration in the first semiconductor layer among elements of Groups 12 to 16 included in the first semiconductor layer differs from a second element with a highest concentration in the second semiconductor layer among elements of Groups 12 to 16 included in the second semiconductor layer, wherein a third element with a highest concentration in the first conductor layer among metal elements or metalloid elements included in the first conductor layer is same as a fourth element with a highest concentration in the second conductor layer among metal elements or metalloid elements included in the second conductor layer, wherein the first electrode is in contact with the first semiconductor layer, wherein the second electrode is insulated from the second semiconductor layer, wherein the second conductor layer is disposed between the second semiconductor layer and the substrate, and wherein the first conductor layer and the second conductor layer are included in a contiguous film.

2. The semiconductor apparatus according to claim 1, wherein a gate electrode of the second transistor is disposed between the substrate and the second semiconductor layer.

3. The semiconductor apparatus according to claim 1, wherein the second semiconductor layer is thinner than the gate electrode of the second transistor.

4. The semiconductor apparatus according to claim 1, further comprising an organic electroluminescence (EL) element disposed above the substrate, wherein the first element is an element of Group 14, and wherein the second element is an element of Group 12, 13, 15, or 16.

5. The semiconductor apparatus according to claim 1, wherein a diagonal length of the substrate is more than or equal to 5 centimeters (cm), wherein one of the first semiconductor layer and the second semiconductor layer is a polycrystalline layer, and the other of the first semiconductor layer and the second semiconductor layer is an oxide semiconductor layer, and wherein a distance between the polycrystalline layer and the substrate is less than a distance between the oxide semiconductor layer and the substrate.

6. Equipment comprising:

the semiconductor apparatus according to claim 1; and a control apparatus connected to the semiconductor apparatus.

7. A semiconductor apparatus comprising:

a substrate;

a first semiconductor layer that is of a first transistor and disposed above the substrate;

a first electrode disposed above the substrate and overlapping the first semiconductor layer, the first electrode including a first conductor layer;

a second semiconductor layer that is of a second transistor and disposed above the substrate;

a second electrode disposed above the substrate and overlapping the second semiconductor layer, the second electrode including a second conductor layer; and a third conductor layer disposed above the substrate and overlapping the second electrode, wherein a first element with a highest concentration in the first semiconductor layer among elements of Groups 12 to 16 included in the first semiconductor layer differs from a second element with a highest concentration in the second semiconductor layer among elements of Groups 12 to 16 included in the second semiconductor layer, wherein a third element with a highest concentration in the first conductor layer among metal elements or metalloid elements included in the first conductor layer is same as a fourth element with a highest concentration in the second conductor layer among metal elements or metalloid elements included in the second conductor layer, wherein the first electrode is in contact with the first semiconductor layer, wherein the second electrode is insulated from the second semiconductor layer, wherein the third conductor layer is not in contact with the second semiconductor layer, and wherein the third conductor layer is insulated from the second conductor layer and the first semiconductor layer.

8. The semiconductor apparatus according to claim 7, wherein the second semiconductor layer is disposed between the substrate and a gate electrode of the second transistor.

9. The semiconductor apparatus according to claim 7, wherein the first electrode is a source electrode of the first transistor, and wherein a source electrode of the second transistor and the gate electrode of the second transistor are disposed on one of a side facing the substrate with respect to the second semiconductor layer and an opposite side of the side facing the substrate.

10. The semiconductor apparatus according to claim 7, further comprising a capacitor in which a dielectric layer is disposed between the second conductor layer and the third conductor layer.

11. Equipment comprising:

the semiconductor apparatus according to claim 2; and an optical member disposed above the semiconductor apparatus, wherein the second semiconductor layer is disposed between the substrate and the optical member.

12. A semiconductor apparatus comprising:

a substrate;

a first semiconductor layer that is of an N-type first transistor and disposed above the substrate;

a first electrode disposed above the substrate and overlapping the first semiconductor layer, the first electrode including a first conductor layer;

a second semiconductor layer that is of a P-type second transistor and disposed above the substrate; and a second electrode disposed above the substrate and overlapping the second semiconductor layer, the second electrode including a second conductor layer, wherein a first element with a highest concentration in the first semiconductor layer among elements of Groups 12 to 16 included in the first semiconductor layer differs from a second element with a highest concentration in the second semiconductor layer among elements of Groups 12 to 16 included in the second semiconductor layer, wherein a third element with a highest concentration in the first conductor layer among metal elements or metalloid elements included in the first conductor layer is same as a fourth element with a highest concentration in the second conductor layer among metal elements or metalloid elements included in the second conductor layer, wherein the first conductor layer is in contact with the first semiconductor layer, and wherein the second electrode is insulated from the second semiconductor layer.

13. The semiconductor apparatus according to claim 12, wherein the second electrode is the gate electrode of the second transistor.

14. The semiconductor apparatus according to claim 12, wherein a gate electrode of the first transistor includes a same element as the third element.

15. The semiconductor apparatus according to claim 12, wherein the first transistor and the second transistor are electrically connected to each other.

16. Equipment comprising:

an imaging apparatus; and a display apparatus, wherein the display apparatus includes the semiconductor apparatus according to claim 12, wherein the display apparatus is able to switch a rate at which display is performed, between a first rate and a second rate higher than the first rate, and wherein the imaging apparatus performs image capturing at a third rate between the first rate and the second rate.

17. A semiconductor apparatus comprising:

a substrate;

a first semiconductor layer that is of a first transistor and disposed above the substrate;

a first electrode disposed above the substrate and overlapping the first semiconductor layer, the first electrode including a first conductor layer;

a second semiconductor layer that is of a second transistor and disposed above the substrate; and a second electrode disposed above the substrate and overlapping the second semiconductor layer, the second electrode including a second conductor layer, wherein a first element with a highest concentration in the first semiconductor layer among elements of Groups 12 to 16 included in the first semiconductor layer differs from a second element with a highest concentration in the second semiconductor layer among elements of Groups 12 to 16 included in the second semiconductor layer, wherein a third element with a highest concentration in the first conductor layer among metal elements or metalloid elements included in the first conductor layer is same as a fourth element with a highest concentration in the second conductor layer among metal elements or metalloid elements included in the second conductor layer, wherein the first electrode is in contact with the first semiconductor layer, wherein the second electrode is insulated from the second semiconductor layer and the first semiconductor layer, and wherein the first conductor layer is disposed between the first semiconductor layer and the substrate.

18. The semiconductor apparatus according to claim 17, wherein the first conductor layer and the second conductor layer are of a same layer.

19. The semiconductor apparatus according to claim 17, wherein the second semiconductor layer is disposed between the gate electrode of the second transistor and the second electrode.

20. The semiconductor apparatus according to claim 17, wherein the first electrode is a source electrode of the first transistor, and wherein the second semiconductor layer is disposed between the gate electrode of the second transistor and a source electrode of the second transistor.

21. The semiconductor apparatus according to claim 17, a drain electrode of the second transistor includes a same element as the fourth element.

22. The semiconductor apparatus according to claim 17, wherein a distance between the first semiconductor layer and the substrate differs from a distance between the second semiconductor layer and the substrate, wherein a distance between the first semiconductor layer and a first gate electrode of the first transistor differs from a distance between the second semiconductor layer and a second gate electrode of the second transistor, wherein a distance between the substrate and the first gate electrode differs from a distance between the substrate and the second gate electrode, and wherein the second conductor layer is noncontiguous to the first conductor layer.

23. Equipment comprising:

an imaging apparatus; and a display apparatus, wherein the display apparatus includes the semiconductor apparatus according to claim 17, wherein the display apparatus is able to switch a rate at which display is performed, between a first rate and a second rate higher than the first rate, and wherein the imaging apparatus performs image capturing at a third rate between the first rate and the second rate, wherein the first rate is less than or equal to 10 frames per second (fps) and the second rate is more than or equal to 100 fps.

24. A semiconductor apparatus comprising:

a substrate;

a first semiconductor layer that is of a first transistor and disposed above the substrate;

a first electrode disposed above the substrate and overlapping the first semiconductor layer, the first electrode including a first conductor layer;

a second semiconductor layer that is of a second transistor and disposed above the substrate; and a second electrode disposed above the substrate and overlapping the second semiconductor layer, the second electrode including a second conductor layer, wherein a first element with a highest concentration in the first semiconductor layer among elements of Groups 12 to 16 included in the first semiconductor layer differs from a second element with a highest concentration in the second semiconductor layer among elements of Groups 12 to 16 included in the second semiconductor layer, wherein a third element with a highest concentration in the first conductor layer among metal elements or metalloid elements included in the first conductor layer is same as a fourth element with a highest concentration in the second conductor layer among metal elements or metalloid elements included in the second conductor layer, wherein the first electrode is in contact with the first semiconductor layer, wherein the second electrode is insulated from the second semiconductor layer, and wherein the second semiconductor layer is disposed between the second electrode and the substrate, and wherein the second semiconductor layer is disposed between the second semiconductor layer and the substrate, wherein the second transistor is a switch transistor.

25. The semiconductor apparatus according to claim 24, wherein the third element differs from the second element, and the fourth element differs from the first element.

26. Equipment comprising:

an imaging apparatus; and a display apparatus, wherein the display apparatus includes the semiconductor apparatus according to claim 24, wherein the display apparatus is able to switch a rate at which display is performed, between a first rate and a second rate higher than the first rate, and wherein the imaging apparatus performs image capturing at a third rate between the first rate and the second rate wherein the first rate is less than or equal to 5 hertz (Hz) and the third rate is from 20 to 80 fps.

27. A semiconductor apparatus comprising:

a substrate;

a first semiconductor layer that is of a first transistor and disposed above the substrate;

a first electrode disposed above the substrate and overlapping the first semiconductor layer, the first electrode including a first conductor layer;

a second semiconductor layer that is of a second transistor and disposed above the substrate; and a second electrode disposed above the substrate and overlapping the second semiconductor layer, the second electrode including a second conductor layer, wherein a first element with a highest concentration in the first semiconductor layer among elements of Groups 12 to 16 included in the first semiconductor layer differs from a second element with a highest concentration in the second semiconductor layer among elements of Groups 12 to 16 included in the second semiconductor layer, wherein a third element with a highest concentration in the first conductor layer among metal elements or metalloid elements included in the first conductor layer is same as a fourth element with a highest concentration in the second conductor layer among metal elements or metalloid elements included in the second conductor layer, wherein the first electrode is in contact with the first semiconductor layer, wherein the second electrode is insulated from the second semiconductor layer, and wherein the first semiconductor layer is an oxide semiconductor layer.

28. The semiconductor apparatus according to claim 27, wherein the third element and the fourth element are copper (Cu) or titanium (Ti).

29. The semiconductor apparatus according to claim 27, wherein the oxide semiconductor layer includes tin (Sn).

30. Equipment including the semiconductor apparatus according to claim 27, the equipment comprising at least any of:

a semiconductor device manufactured in 1 to 4 nanometers (nm) process;

a communication apparatus configured to perform communication using terahertz waves; and a solid-state battery.

* * * * *